(12) United States Patent
Zheng et al.

(10) Patent No.: US 8,759,875 B1
(45) Date of Patent: Jun. 24, 2014

(54) VERTICAL NANOWIRE BASED HETERO-STRUCTURE SPLIT GATE MEMORY

(71) Applicant: GLOBALFOUNDRIES Singapore Pte. Ltd., Singapore (SG)

(72) Inventors: Ping Zheng, Singapore (SG); Eng Huat Toh, Singapore (SG); Yuan Sun, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 5 days.

(21) Appl. No.: 13/707,617

(22) Filed: Dec. 7, 2012

(51) Int. Cl.
*H01L 29/66* (2006.01)

(52) U.S. Cl.
USPC ........... 257/192; 257/204; 257/297; 257/314; 257/316; 438/200; 438/257; 438/258; 438/285

(58) Field of Classification Search
CPC .................... H01L 27/11556; H01L 27/2454; H01L 29/732; H01L 29/7827
See application file for complete search history.

(56) References Cited

U.S. PATENT DOCUMENTS 5,627,390 A * 5/1997 Maeda et al. ................. 257/302

* cited by examiner

*Primary Examiner* — Kyoung Lee
(74) *Attorney, Agent, or Firm* — Horizon IP Pte. Ltd.

(57) ABSTRACT

A memory cell is disclosed. The memory cell includes a vertical base disposed on a substrate. The vertical base includes first and second channels between top and bottom terminals. The memory cell also includes a first gate surrounding the first channel and a second gate surrounding the second channel. The first and second gates form a gate-all-around transistor of the memory cell.

20 Claims, 37 Drawing Sheets

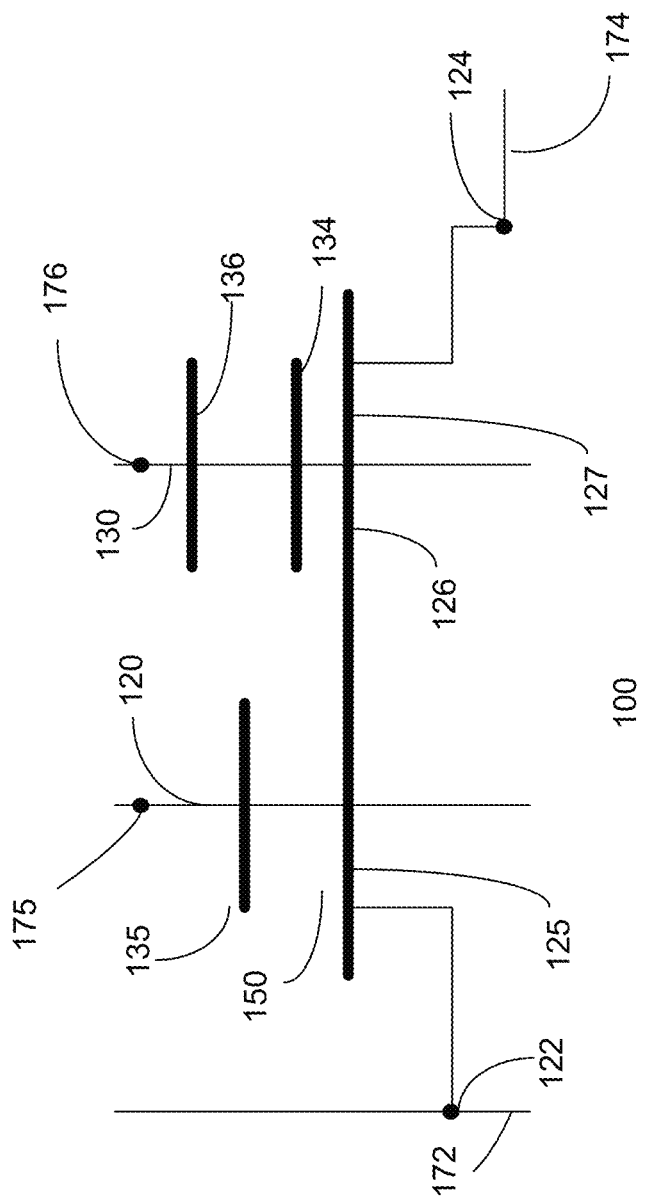

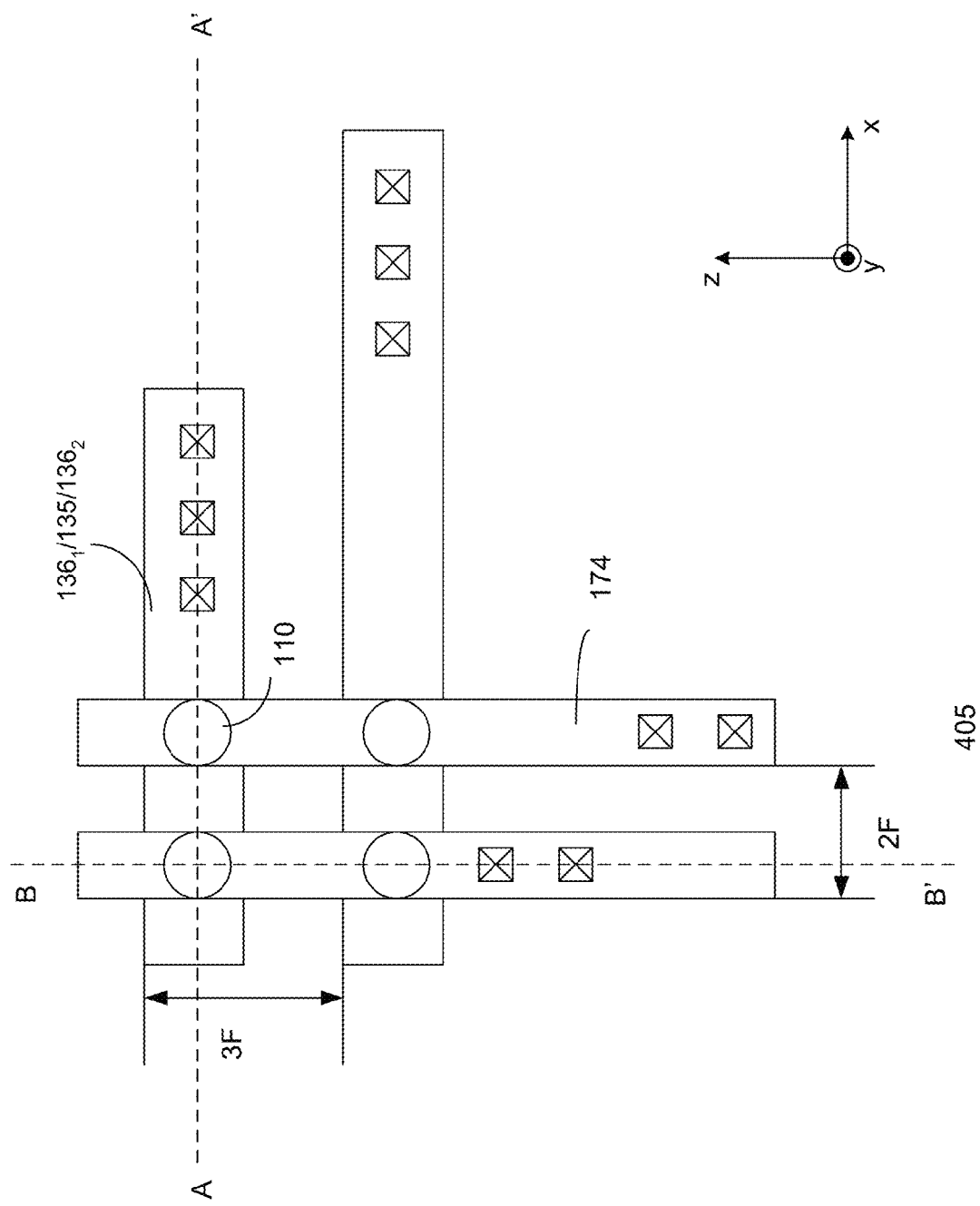

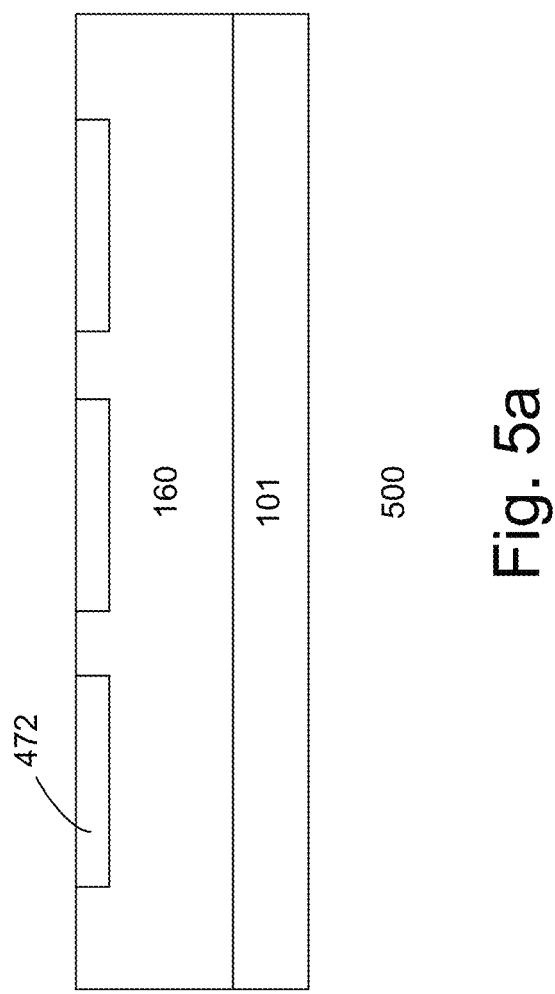

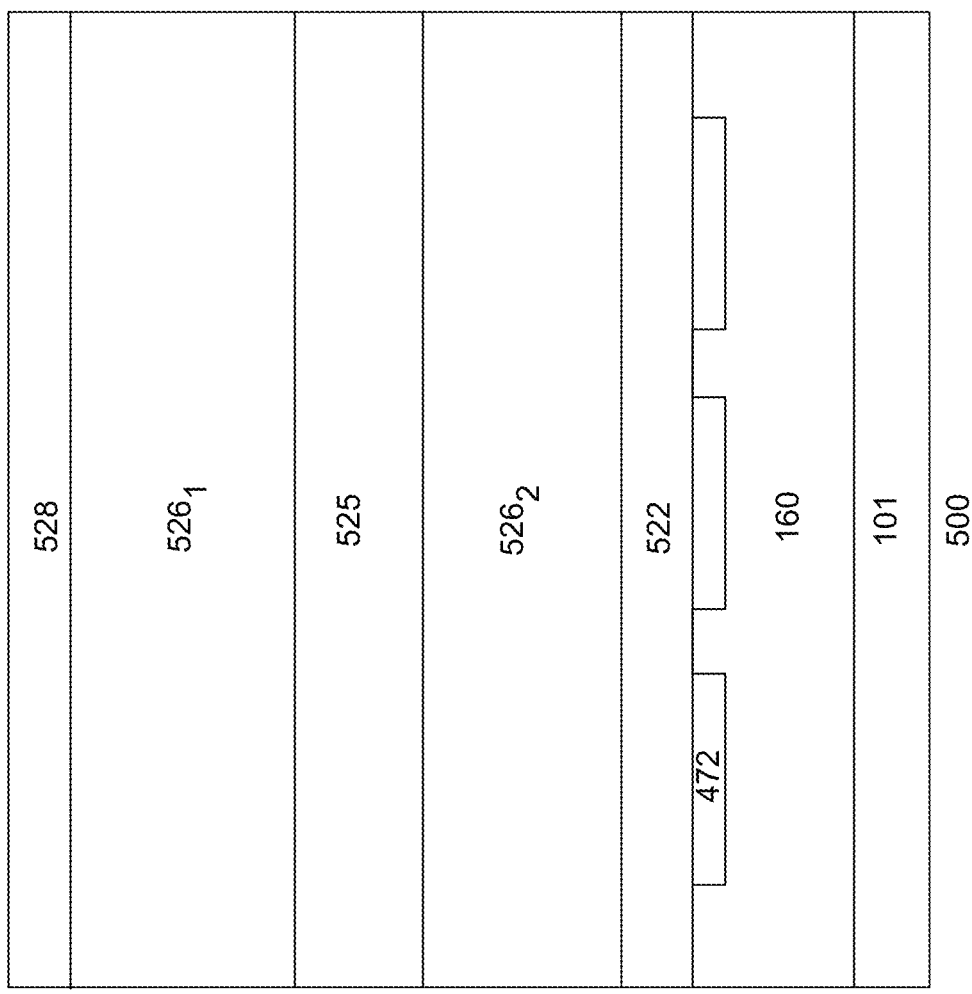

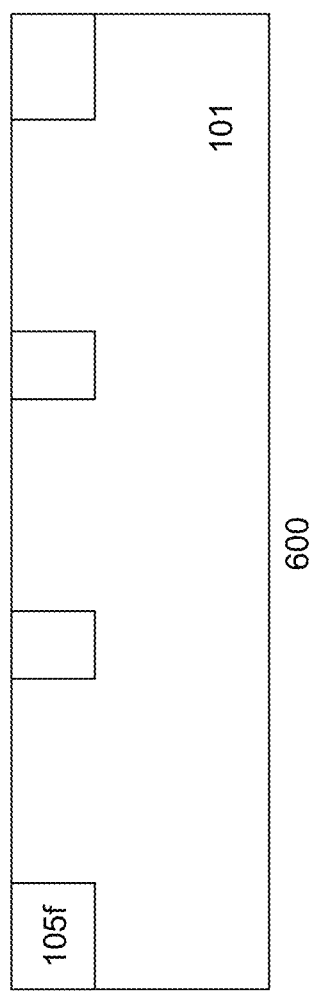

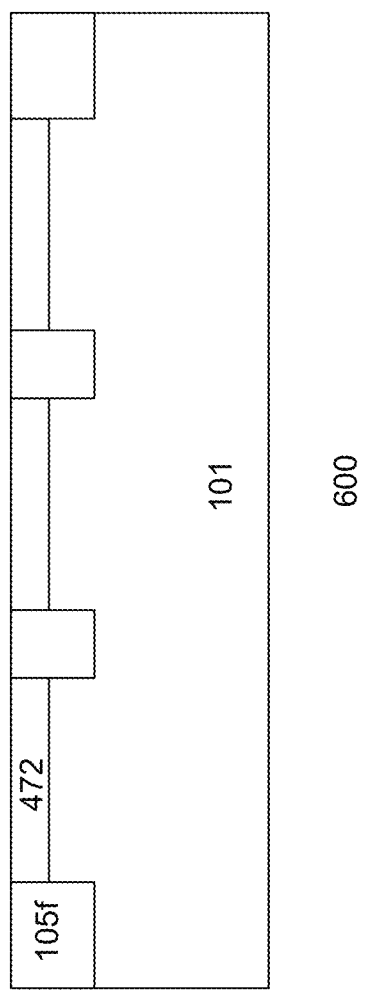

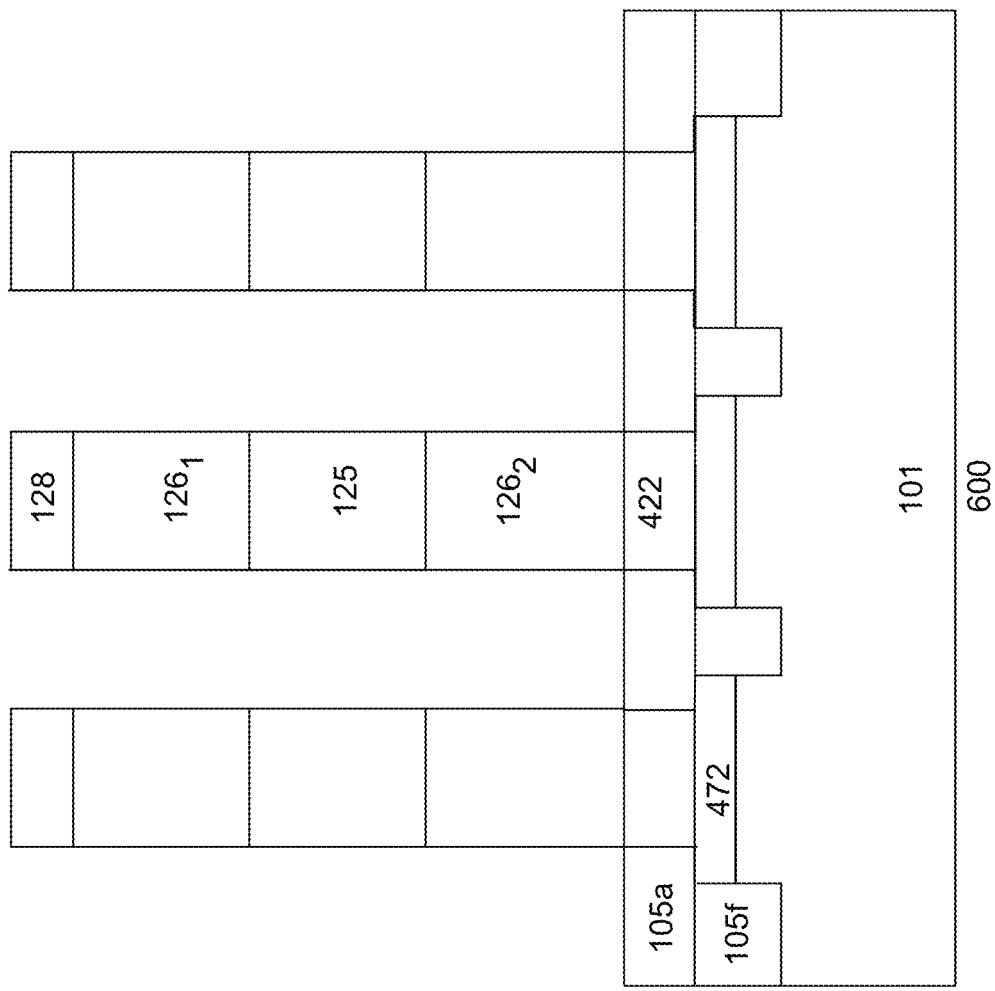

US 8,759,875 B1

VERTICAL NANOWIRE BASED HETERO-STRUCTURE SPLIT GATE MEMORY

BACKGROUND

Non-volatile memory (NVM) circuits have achieved widespread adoptions for code and data storage applications. However, conventional flash memories such as floating gate memories are facing severe scaling issues, for example, limitation imposed by the low electron count in the scaled cell. In addition, short channel effects, cross-talk interference, program/erase speeds and reliability issues may also hinder the scaling of the memory cell dimensions.

Therefore, it is desirable to provide a highly scalable device which can offer reduced cell area, less power consumption and better memory performance and reliability.

SUMMARY

A memory cell is disclosed. The memory cell includes a vertical base disposed on a substrate. The vertical base includes first and second channels between top and bottom terminals. The memory cell also includes a first gate surrounding the first channel and a second gate surrounding the second channel. The first and second gates form a gate-all-around transistor of the memory cell.

In another embodiment, a method of forming a device is presented. The method includes providing a substrate and forming a vertical base on the substrate. The base includes first and second channels between top and bottom terminals of a memory cell. The method also includes forming first and second gates surrounding the first and second channels.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following FIG. 1a shows a schematic diagram of an embodiment of a memory cell;

FIG. 4c-d show different views of a portion of an array;

FIGS. 5a-h show cross-sectional views of an embodiment of a process 500 for forming memory cells; and FIGS. 6a-h show cross-sectional views of an embodiment of a process 600 for forming memory cells.

DETAILED DESCRIPTION

Figure 1B:
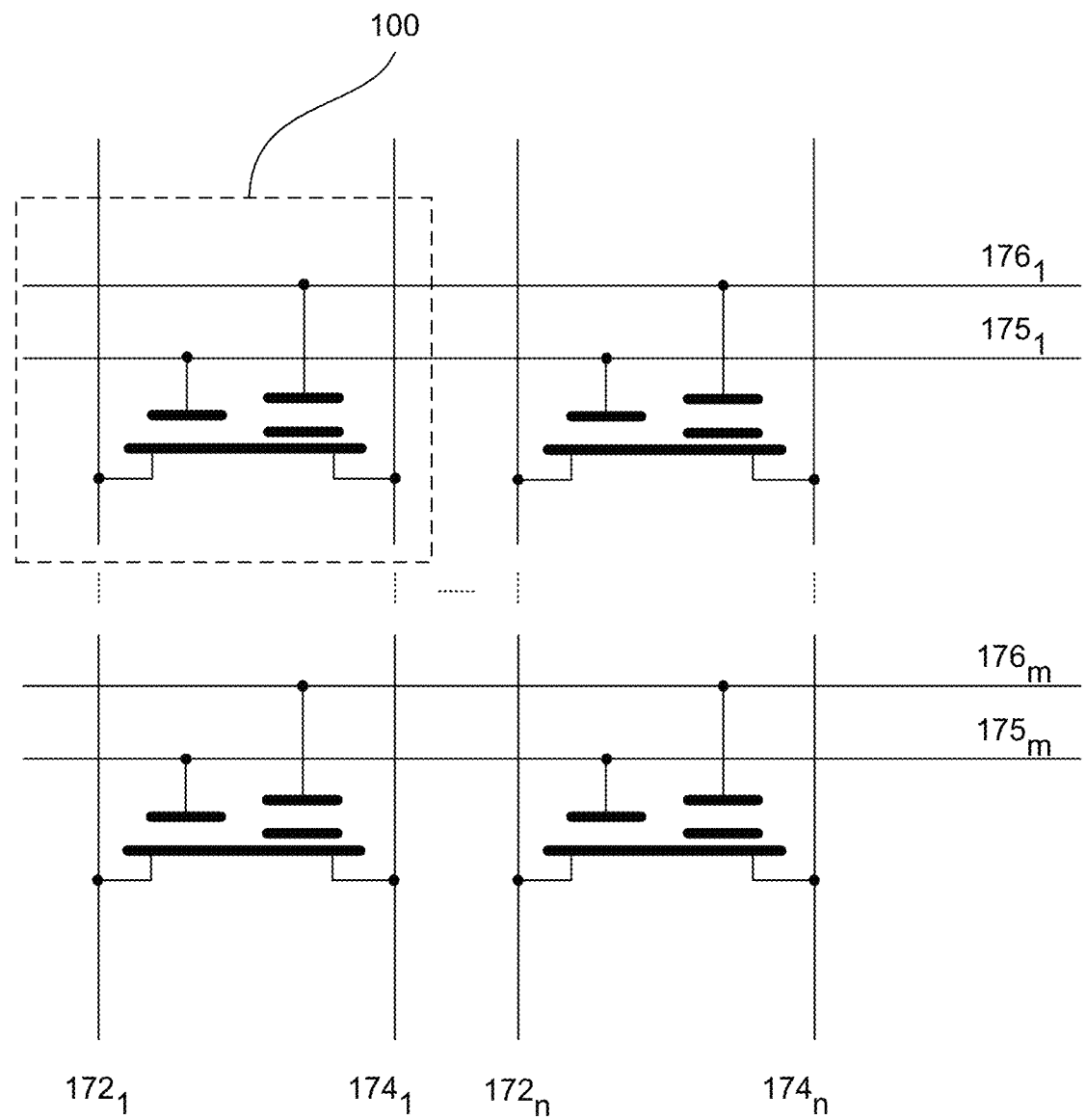
FIG. 1b shows an embodiment of a memory array which uses a common source line.

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

FIG. 1a shows a schematic diagram of an embodiment of a memory cell 100. In one embodiment, the memory cell includes a non-volatile memory cell. In one embodiment, the memory cell includes a transistor with a gate between first and second cell terminals 122 and 124. The gate, in one embodiment, is a split gate with multiple gates. In one embodiment, the gate is a split gate having a first gate 120 and a second gate 130. Providing a split gate with other number of gates may also be useful. The first gate is adjacent to the first cell terminal and the second gate is adjacent to the second cell terminal. The first gate is a select gate (SG) and the second gate is a memory gate (MG). The SG, for example, controls access to the memory cell while the MG is the storage node for storing data.

In one embodiment, the SG includes a first gate electrode 135 over a first gate dielectric 150. The SG is disposed over a first gate channel 125. The first gate electrode may be polysilicon and the first gate dielectric may be silicon oxide. Other types of gate electrode or gate dielectric materials may also be useful. For example, the gate electrode may be a metal gate electrode and the dielectric may be HfSiON, SiON or $HfO_2$. The first gate electrode serves as a first gate terminal 175. As for the first gate channel, it may be a crystalline semiconductor channel.

The MG includes a second gate electrode 136 over a second gate dielectric 134. The MG is disposed over a second gate channel 126. The second gate electrode may be polysilicon. Other types of gate electrode materials, such as metal gate electrodes, may also be useful. The second gate electrode serves as a second gate terminal 176. As for the second gate dielectric, it serves as a charge storage dielectric. The charge storage dielectric may be a dielectric stack. For example, the charge storage dielectric may be an oxide-nitride-oxide (ONO) stack with first and second oxide layers sandwiching a nitride layer. The first oxide layer may serve as a tunneling oxide, the second oxide layer may serve as a blocking oxide, and the nitride layer sandwiched between the two oxide layers may serve as a charge storage layer to store charges. Other types of charge storage dielectrics may also be useful. For example, a charge storage dielectric may include storage dielectric stacks such as an oxide/a-Si/oxide, an oxide/nanocrystal/oxide, an oxide/nitride/$Al_2O_3$, a nanocrystal embedded in oxide or an oxide-metal (high-K)-oxide stack. In yet other embodiments, the storage layer may include a plurality of storage stacks. As for the second gate channel, it may be a crystalline semiconductor channel.

The cell terminals, for example, may be doped regions. The first cell terminal may be a source of the transistor and the second cell terminal is a drain of the transistor. The doped or source/drain (S/D) regions may be doped with first polarity type dopants. In one embodiment, the S/D regions are heavily doped with first polarity type dopants. The dopant concentration of the S/D regions, for example, may be about $10^{19}$-$10^{20}$ cm⁻³. Other dopant concentrations may also be useful. The first polarity type dopants may be n-type, forming a memory cell with an n-type transistor. Alternatively, the first polarity type is p-type for forming a p-type memory cell. P-type dopants can include boron (B), aluminum (Al), indium (In) or a combination thereof, while n-type dopants can include phosphorus (P), arsenic (As), antimony (Sb) or a combination thereof.

In one embodiment, a first terminal line 172 is coupled to the first cell terminal and a second terminal line 174 is coupled to the second cell terminal. The first terminal line serves as a common source line (SL) and the second terminal line serves as a bitline (BL). First and second gate lines are coupled to first and second gates. For example, the first gate electrode or terminal is coupled to a first gate line and the second gate electrode or terminal is coupled to a second gate line. In one embodiment, the first gate line is a wordline (WL) and the second gate line is a memory gate line (ML). Other configurations of BLs, WLs, SLs and MLs may also be useful.

An access to the memory cell may include different types of memory access operations. In one embodiment, memory access operations include write, erase and read operations. Appropriate signals or voltages may be applied to the different terminals of the memory cell, for example, via the BL, MG and SG, to perform the desired memory access operation on the desired bit of the memory cell. Table 1a shows the various signals applied to the terminals of the memory cell, depending on the desired operation and bit to access.

TABLE 1a

| Operation | BL (Sel.) | BL (Unsel.) | MG (Sel.) | MG (Unsel.) | SG (Sel.) | SG (Unsel.) | SL |
|---|---|---|---|---|---|---|---|
| Write | $V_{HIGH}$ | 0V | $V_{MG,PGM}$ | 0V | $V_{HIGH}$ | 0V | 0V |
| Erase | 0V | 0V | $V_{MG,ERS}$ | 0V | 0V | 0V | 0V |
| Read | $V_{READ}$ | 0V | $V_{MG,RD}$ | 0V | $V_{HIGH}$ | 0V | 0V |

Table 1b shows some embodiments of the values for the different signals applied to the terminals of an n-type memory cell and a p-type memory cell.

TABLE 1b

| | n-type cell (V) | p-type cell (V) |
|---|---|---|
| $V_{HIGH}$ | 1.2 | −1.2 |
| $V_{MG,PGM}$ | 5 | −5 |
| $V_{MG,ERS}$ | −6 | 6 |
| $V_{READ}$ | 0.8 | −0.8 |
| $V_{MG,RD}$ | 2 | −2 |

Providing signals of other voltages to the terminals of the memory cell may also be useful. For example, +2 V may also be applied for the $V_{MG,PGM}$ of the n-type cell.

The first and second gate channels are contiguous channels, forming a common channel for the gates. For example, the SG and MG channels are contiguous channels. In one embodiment, the common channel is a heterogeneous gate channel or structure. The SG channel is formed of a different crystalline material than the MG channel. For example, the first gate channel has a first crystalline semiconductor material and the second gate channel has a second crystalline semiconductor material. In one embodiment, the SG channel has a first crystalline semiconductor material and the MG channel has a second crystalline semiconductor material, wherein the band gap of the first crystalline semiconductor material is larger than that of the second crystalline semiconductor material. In one embodiment, the first crystalline semiconductor material is silicon (Si) and the second crystalline semiconductor material is silicon germanium (SiGe). Other combinations of first and second crystalline semiconductor materials in which the band gap of the second semiconductor material is smaller than that of the first is also useful.

In another embodiment, the second gate channel is a heterogeneous channel. For example, the MG channel is a heterogeneous second gate channel having first and second portions formed of different crystalline semiconductor materials. The first portion is adjacent to the first gate channel and the second portion is adjacent to the second doped or drain region. In one embodiment, the first portion has a first portion semiconductor material which has a lower band gap than the first crystalline semiconductor material of the first gate channel. As for the second portion, it has a second portion semiconductor material having a higher band gap than the first portion.

The memory cell with heterogeneous channels as described above has improved immunity to punch-through and program disturb in the MG. Furthermore, heterogeneous channels result in higher programming speed and reduced power consumption. For example, providing crystalline semiconductor material with smaller band gap in the channel buffer portion and a portion of the MG channel adjacent to the source side enhances source side injection and improves secondary electron injection, leading to faster programming speed. Providing the MG channel with a single second crystalline semiconductor material having a smaller band gap induces hot holes which enhances erasure speed, particularly in n-type devices. On the other hand, providing the MG channel which is a heterogeneous second gate channel can further reduce leakage in the MG.

In one embodiment, the first and second gate channels are configured as vertical channels. For example, the vertical channels are in a direction perpendicular to a plane of the substrate on which the memory cell is disposed or formed. Providing a memory cell with vertical channels facilitates high density integration since no increased surface area is needed for the second gate channel.

A plurality of memory cells may be interconnected by SLs, BLs, WLs and MLs to form a memory array 103, as shown in FIG. 1b. The array includes a plurality of memory cells 100, as described in FIG. 1a. Common elements may not be described or described in detail. The array includes n BLs, n SLs, m WLs and m MLs, forming an array having m rows and n columns of memory cells. As shown, the memory cells are configured as NOR cells.

Figure 1C:
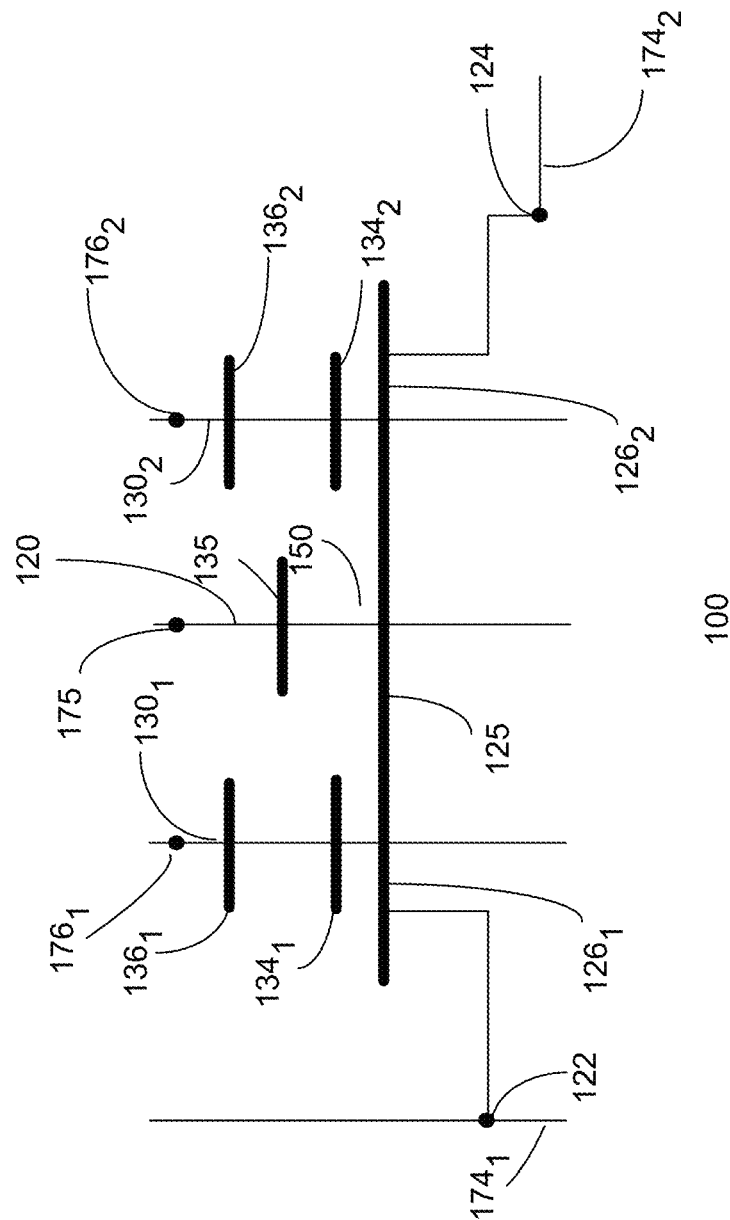
FIG. 1c shows a schematic diagram of another embodiment of a memory cell.

FIG. 1c shows a schematic diagram of another embodiment of a memory cell 100. As shown, the memory cell is similar to that described in FIG. 1a. Common elements may not be described or described in detail. In one embodiment, the memory cell includes an NVM cell. In one embodiment, the memory cell includes a transistor having a gate between first and second cell terminals 122 and 124. The cell terminals include heavily doped regions with first polarity type dopants. The gate, in one embodiment, is a split gate with multiple gates. In one embodiment, the gate is a split gate having an intermediate gate 120 between first and second gates $130_{1-2}$. Providing a split gate with other number of gates may also be useful. The first gate is adjacent to the first cell terminal and the second gate is adjacent to the second cell terminal. The first and second gates are first and second memory gates MG1 and MG2 corresponding to first and second data bits of the memory cell and the intermediate gate is an SG. The SG controls access to the MG1 and MG2.

In one embodiment, the SG includes an intermediate gate electrode 135 over an intermediate gate dielectric 150. The SG is disposed over an intermediate gate channel 125. The intermediate gate electrode may be polysilicon and the intermediate gate dielectric may be silicon oxide. Other types of gate electrode or gate dielectric materials may also be useful. As for the intermediate gate channel, it is a crystalline semiconductor channel. The intermediate gate electrode serves as an intermediate gate terminal (175).

The first gate includes a first gate electrode $136_1$ over a first gate dielectric $134_1$; the second gate includes a second gate electrode $136_2$ over a second gate dielectric. The memory gates are disposed over first and second gate channels $126_{1-2}$. The gate electrode may be polysilicon. Other types of gate electrode materials may also be useful. The first and second gate electrodes serve as first and second gate terminals $176_{1-2}$. As for the gate dielectric, it serves as a charge storage dielectric. The charge storage dielectric may be a dielectric stack, such as an ONO stack. Other types of charge storage dielectrics may also be useful. As for the first and second gate channels, they are crystalline semiconductor channels.

In one embodiment, first and second terminal lines $174_{1-2}$ are coupled to the first and second cell terminals. The first and second terminal lines serve as first and second bitlines BL1 and BL2. First and second gate lines are coupled to first and second gates. For example, the first gate electrode or terminal is coupled to a first gate line and the second gate electrode or terminal is coupled to a second gate line. The first and second gate lines serve as first and second memory gate lines ML1 and ML2. An intermediate gate line is coupled to the intermediate gate. The intermediate gate line serves as a WL. Other configurations of BLs, WLs, MLs may also be useful.

An access to a bit of the memory cell may include different types of memory access operations. In one embodiment, memory access operations include write, erase and read operations. Appropriate signals or voltages may be applied to the different terminals of the memory cell, for example, via the BL, MG and SG, to perform the desired memory access operation on the desired bit of the memory cell. Table 2a shows the various signals applied to the terminals of the memory cell, depending on the desired operation and bit to access.

TABLE 2a

| Operation | BL (Sel.) | BL (Unsel.) | MG (Sel.) | MG (Unsel.) | SG (Sel.) | SG (Unsel.) |
|---|---|---|---|---|---|---|
| Write | $V_{BL,PGM}/0$ | $V_{INHIBIT}$ | $V_{MG,PGM}/V_{PASS}$ | 0V | $V_{HIGH}$ | 0V |
| Erase | 0V | 0V | $V_{MG,ERS}$ | 0V | 0V | 0V |
| Read | $V_{BL,READ}/0$ | 0V | $V_{MG,RD}/V_{PASS}$ | 0V | $V_{HIGH}$ | 0V |

Table 2b shows some embodiments of the values for the different signals applied to the terminals of an n-type memory cell and a p-type memory cell.

TABLE 2b

|  | n-type cell (V) | p-type cell (V) |
|---|---|---|
| $V_{BL,PGM}$ | 1.2 | −1.2 |
| $V_{INHIBIT}$ | 5 | −5 |
| $V_{MG,PGM}$ | 5 | −5 |
| $V_{PASS}$ | 3 | −3 |
| $V_{HIGH}$ | 1.2 | −1.2 |
| $V_{MG,ERS}$ | −6 | 6 |
| $V_{BL,READ}$ | 0.8 | −0.8 |

TABLE 2b-continued

|  | n-type cell (V) | p-type cell (V) |
|---|---|---|
| $V_{MG,RD}$ | 2 | −2 |

Providing signals of other voltages to the terminals of the memory cell may also be useful. For example, +2 V may also be applied for the $V_{MG,PGM}$ of the n-type cell.

The first, intermediate and second gate channels are contiguous channels, forming a common channel for the gates. For example, the first MG, SG and second MG channels are contiguous channels. In one embodiment, the common channel is a heterogeneous gate channel or structure. The intermediate channel is formed of a different crystalline material than the MG channels. For example, an intermediate semiconductor material of the intermediate gate channel has a higher band gap than the memory semiconductor materials of the MG channels. In one embodiment, the intermediate semiconductor material is Si and the memory semiconductor material is SiGe. Other combinations of intermediate and memory semiconductor materials may also be useful. Preferably, the MG channels are formed of the same memory semiconductor material.

In one embodiment, the intermediate, first and second gate channels are configured as vertical channels. For example, the vertical channels are in a direction perpendicular to a plane of the substrate on which the memory cell is disposed or formed. Providing a memory cell with vertical channels facilitates high density integration.

Figure 1D:
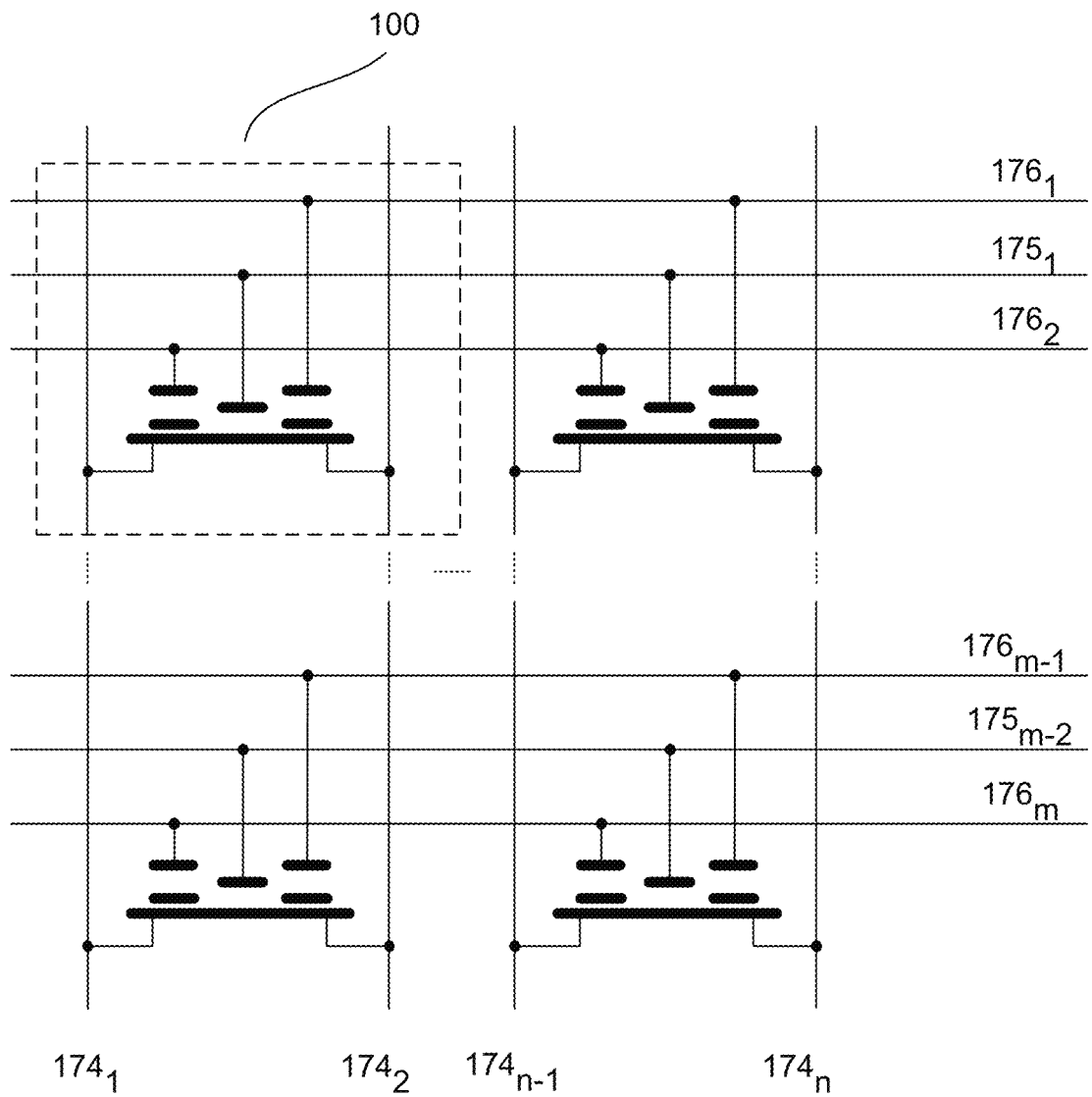
FIG. 1d shows another embodiment of a memory array.

A plurality of memory cells may be interconnected by BLs, WLs and MLs to form a memory array 103, as shown in FIG. 1d. The array includes a plurality of memory cells 100, as described in FIG. 1c. For example, the array includes a plurality of multi-bit memory cells. Common elements may not be described or described in detail. The array includes n BLs, m/2 WLs and m MLs, forming an array having m rows and n columns of memory cells. As shown, the memory cells are configured as NOR cells. Other configurations may also be useful.

Figure 2A:
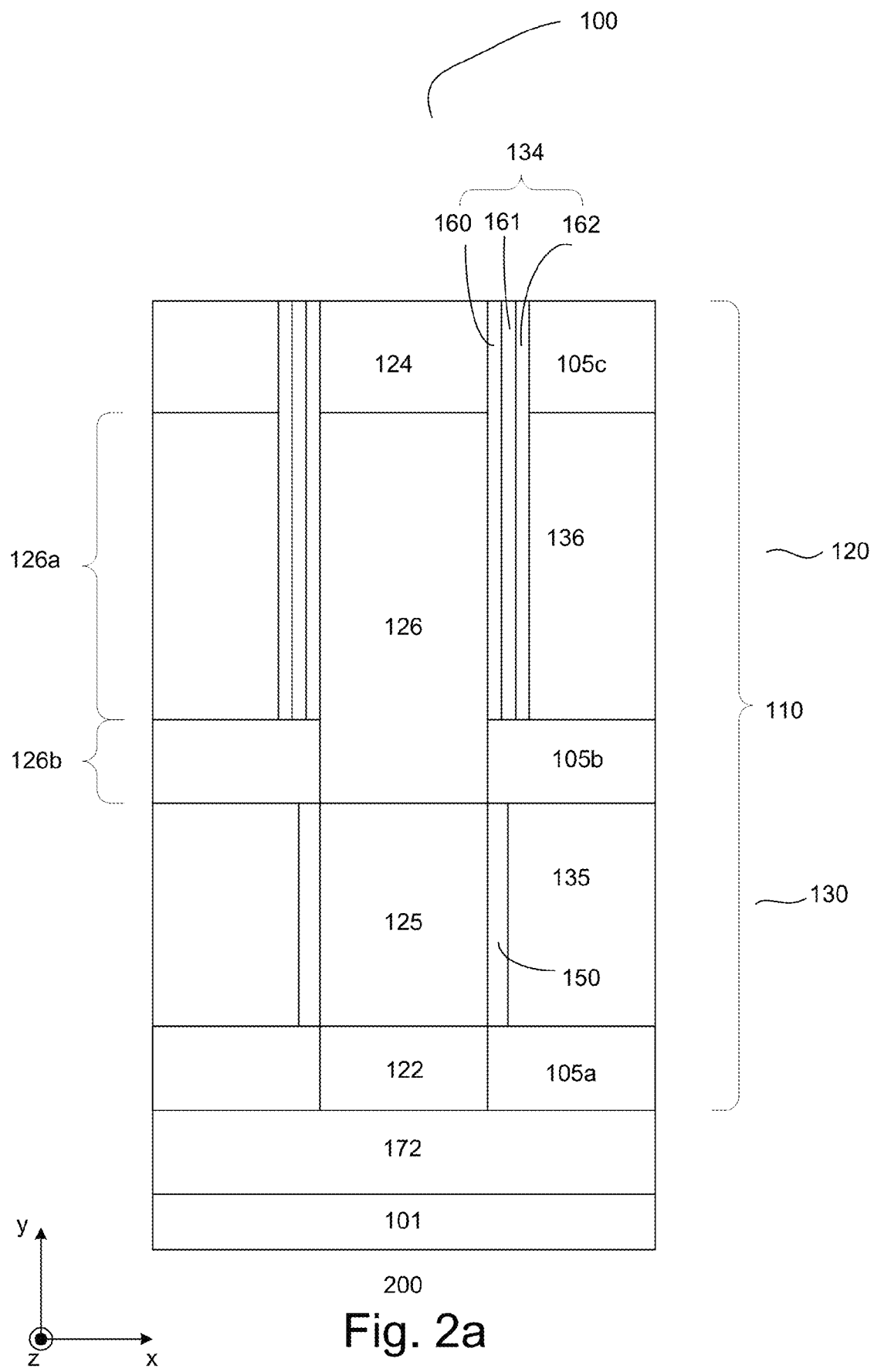
FIG. 2a-c show a portion 200 of embodiments of a device or IC.
Figure 2B:
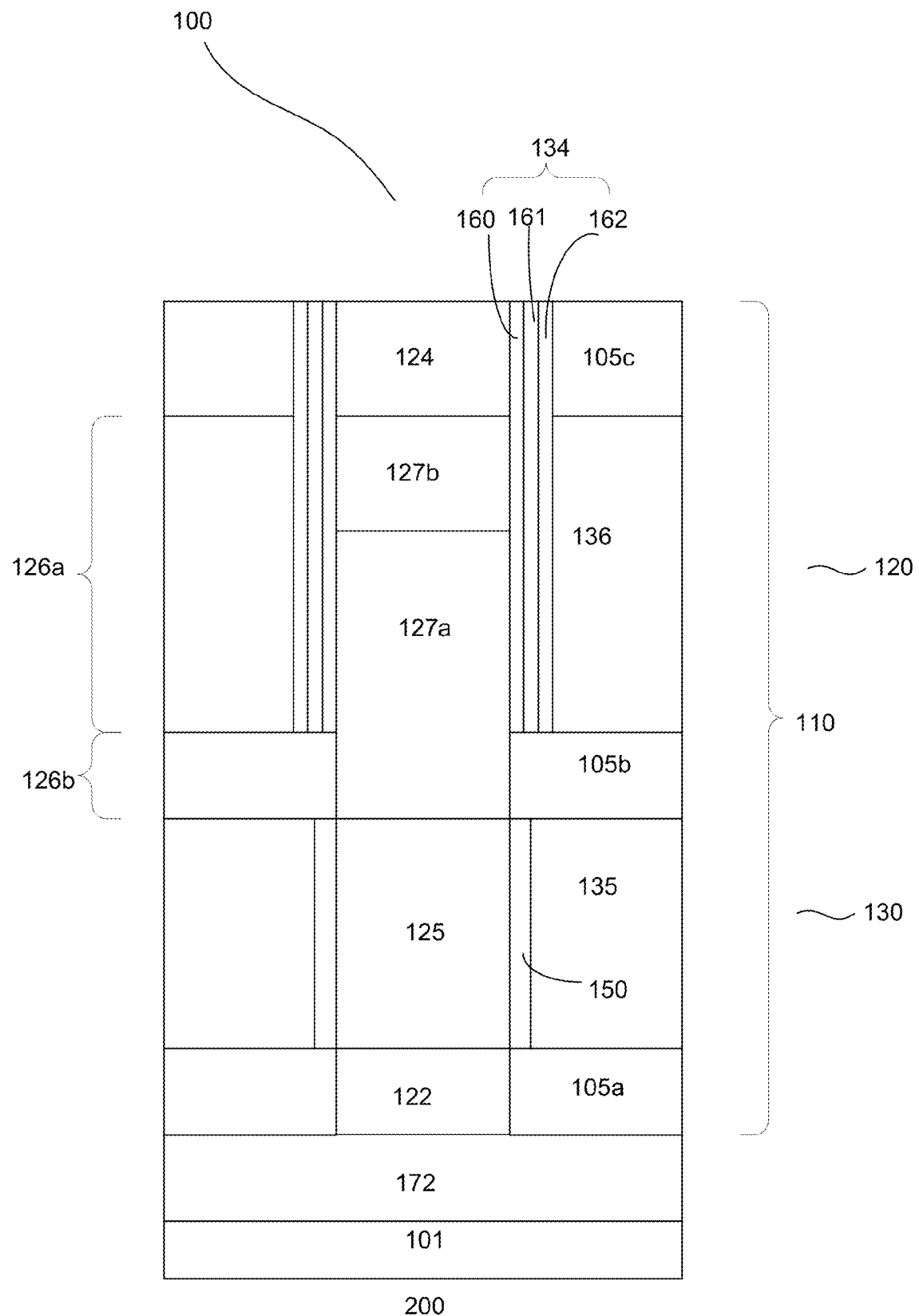
Figure 2C:
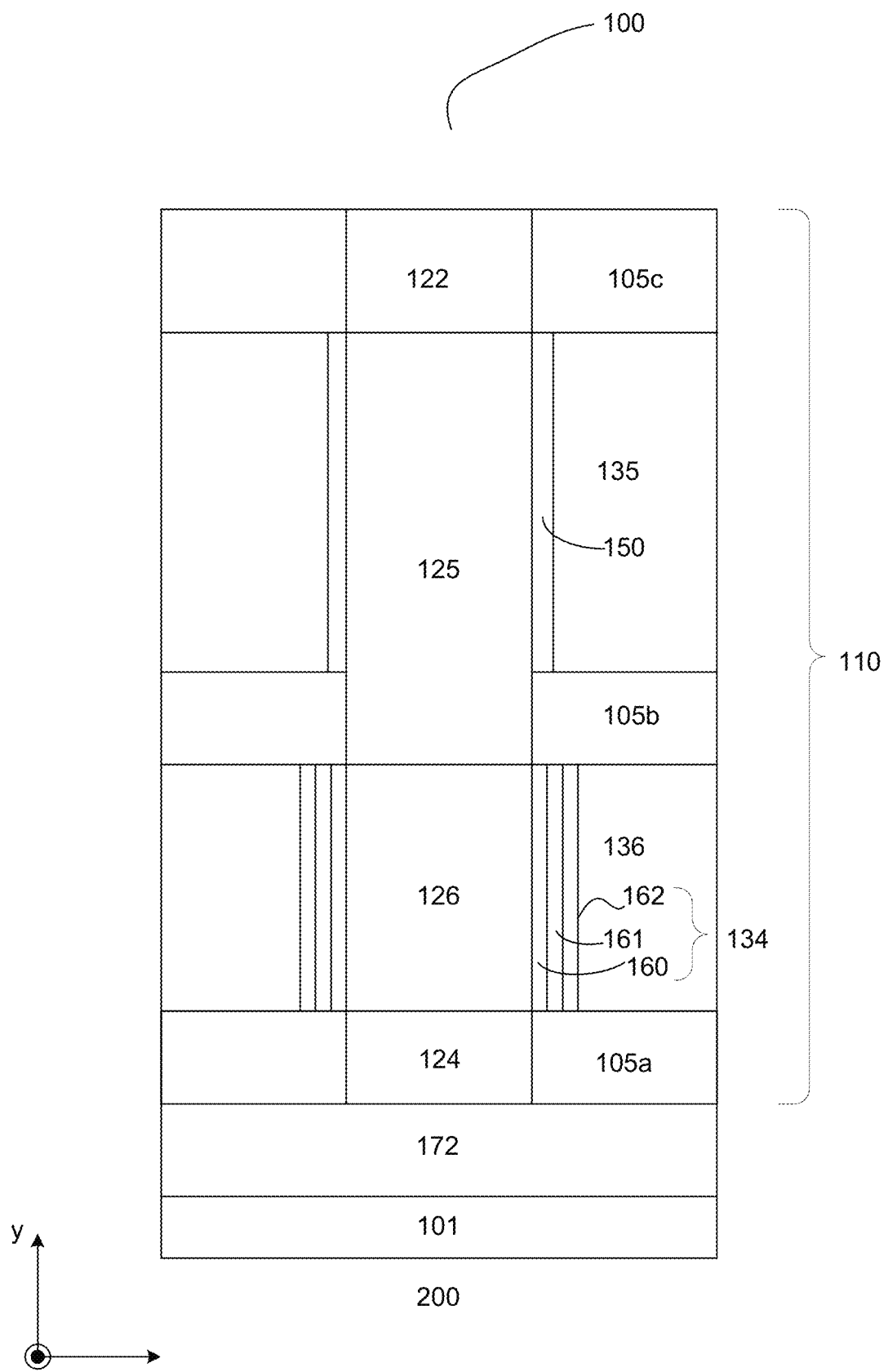

FIGS. 2a-c shows cross-sectional views of a portion 200 of embodiments of a device or IC. The portion of the device includes a cell region on which a memory cell 100 is formed. The cell region, for example, is part of an array region having a plurality of cell regions formed on a substrate 101. The substrate may include other types of device regions. For example, the substrate may include a support region for devices for accessing the memory array. Additional device regions, such as logic regions, may also be provided. The substrate may include regions for other types of circuitry, depending on the type of device or IC.

The substrate, for example, is a semiconductor substrate, such as a silicon substrate. For example, the substrate may be a lightly doped p-type substrate. Providing an intrinsic or other types of doped substrates with such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be a dielectric insulating material. The insulator layer, for example, is formed from silicon oxide, providing a buried oxide (BOX) layer. Other types of dielectric insulating materials may also be useful. The COI substrate, for example, is a silicon-on-insulator substrate. For example, the surface and bulk crystalline layers are single crystalline silicon. Other types of COI substrates may also be useful. It is understood that the surface and bulk layers need not be the same material.

The memory cell includes a transistor. The transistor is formed in the cell region on a substrate 101. The cell region includes a doped well (not shown) with second polarity type dopants. The doped well may be lightly or intermediately doped. For example, the dopant concentration of the doped well may be about $10^{15}$-$10^{17}$ cm$^{-3}$. Other dopant concentrations may also be useful. The doped well, for example, may be an array doped well in the array region.

The cell region includes a bottom terminal line 172 disposed in the substrate. The terminal line is disposed along a first direction. For example, the terminal line may be disposed along the z direction. Other first directions may also be useful. In one embodiment, the terminal line is heavily doped with first polarity type dopants. For example, the substrate may be heavily doped with first polarity type dopants to form the terminal line. The dopant concentration of the bottom terminal line may be about $10^{19}$-$10^{20}$ cm$^{-3}$. Other dopant concentrations for the bottom terminal line may also be useful. The cross-sectional dimensions of the bottom terminal lines may be about 2F (where F=half pitch) wide and 400 Å thick. Other cross-sectional dimensions may also be useful, depending on, for example, technology node.

A base 110 of the transistor is disposed on the substrate in contact with the bottom terminal line. The base, in one embodiment, is a nanowire base. The nanowire may have a circular cross-sectional shape. The cross-sectional dimension of the nanowire may be about 1F. Other cross-sectional shapes or dimensions may also be useful. Other types of bases may also be useful. In one embodiment, the base is a vertical base. The base may be disposed on the substrate along a vertical direction perpendicular to the substrate surface. For example, the base may be disposed on the substrate in the y direction.

The base includes bottom and top memory terminals 122 and 124 disposed at ends of the base. The bottom memory terminal is disposed on the substrate in contact with the bottom terminal line. The terminals may be heavily doped regions with first polarity type dopants. The dopant concentration of the terminals may be about $10^{19}$-$10^{20}$ cm$^{-3}$. Other dopant concentrations may also be useful. The bottom terminal may have a thickness or height of about 400 Å. Other thicknesses may also be useful. In other embodiments, the bottom terminal line and the bottom terminal are part of the substrate. In such case, the base includes the first and second channel regions and the top terminal. Other configurations of the base may also be useful.

The portion of the base between the terminals serves as a body for the transistor. In one embodiment, the body includes lower and upper channel regions 125 and 126. The lower channel region is disposed adjacent to the bottom terminal and the upper channel region is disposed adjacent to the second terminal. The channel regions may be lightly or intermediately doped with second polarity type dopants. For example, the dopant concentration of the channel regions may be about $10^{15}$-$10^{17}$ cm$^{-3}$. Other dopant concentrations may also be useful. The channel regions serve as channels for lower and upper gates 120 and 130 of a split gate of the transistor. In one embodiment, the lower gate is a SG and the upper gate is a MG. That is, the SG is closer to the substrate than the MG. The SG, for example, may correspond to the first gate and the MG may correspond to the second gate. Alternatively, the MG may be closer to the substrate than the SG. For example, the lower gate may be the MG and the upper gate may be the SG.

In one embodiment, the channels are vertical channels. For example, the upper and lower channels are disposed along the y direction, perpendicular to the plane of the substrate surface. A height of the channel is equal to its channel length. In one embodiment, the SG channel length is about 100 nm and MG channel length is about 100 nm. As shown, the MG channel region 126 of the base includes the MG channel portion 126a as well as a gap portion or a channel buffer portion 126b between SG and MG, of which the source side electron injection will take place. The height of the channel buffer portion, for example, is about 10 nm. Other configurations and dimensions of the channel regions may also be useful.

The base includes different types of crystalline semiconductor materials, forming a heterogeneous base. In one embodiment, the first and second channel regions are formed of different types of crystalline semiconductor materials, forming heterogeneous channels. For example, the SG channel may be formed of a first crystalline semiconductor material and the MG channel may be formed of a second semiconductor material. The terminal portions may be formed of a terminal crystalline semiconductor material. The terminal crystalline material may be the same as the first semiconductor crystalline material. Providing terminal materials different from the first semiconductor material may also be useful.

In one embodiment, the first semiconductor material for the SG channel has a higher band gap than the second semiconductor material for the MG channel. In one embodiment, the first semiconductor material is Si and the second semiconductor material is SiGe. In one embodiment, the terminal portions are formed of Si. Other configurations of first, second and terminal semiconductor materials may also be useful.

In another embodiment, as shown in FIG. 2b, the MG channel region 126 is a heterogeneous channel region. For example, the MG channel region includes a main portion 127a with the second crystalline material and a secondary portion 127b with a third crystalline material. The third crystalline material, in one embodiment, is the same as the first crystalline material. For example, the main portion is SiGe and the secondary portion is Si. Other configurations of the second channel region may also be useful. The main portion includes the channel buffer portion 126b as well as a part of the MG channel 126a.

The SG and MG surround the SG and MG channels, forming a gate-all-around transistor. The SG includes a first or SG gate electrode 135 over a first or SG gate dielectric 150. The SG gate dielectric lines the SG channel of the base. The SG gate dielectric may be silicon oxide. For example, the SG gate dielectric may be thermal oxide. The thickness of the SG gate dielectric may be about 20 Å. Other types of gate dielectric or dimensions may also be useful. As for the MG, it includes a second or MG gate electrode 136 over a second gate or MG dielectric 134. The second gate dielectric serves as a charge storage dielectric. The charge storage dielectric may be a dielectric stack. For example, the charge storage dielectric may be an oxide-nitride-oxide (ONO) stack with first and second oxide layers 160 and 162 sandwiching a nitride layer 161. The first oxide layer may be about 50 Å thick, the second oxide layer may be about 70 Å thick and the nitride layer may be about 70 Å thick. Other types of charge storage dielectrics or dimensions may also be useful.

As for the gate electrodes, they may be polysilicon. The thickness of the gate surrounding the base may be about 300 Å. Other types of gate electrodes or dimensions may also be useful. It is understood that the gate electrodes may be formed of the same material or different materials. The gate electrodes may extend horizontally. For example, the gate electrodes may extend in the x direction. The gate electrodes may be common gate electrodes along the x-direction, forming a row of memory cells.

A top terminal line (not shown) is disposed over the base coupled to the top terminal on a top end of the base. The top terminal line, for example, may be copper or copper alloy. Other types of conductive materials may also be useful to form the top terminal line. The top terminal line may be disposed in a metal level of the device. The top terminal line, in one embodiment, is along a second direction. For example, the second terminal line may be along the z direction. The bottom and top terminal lines, in one embodiment, are parallel to each other. The top terminal lines, for example, may be about 1F wide and 450 Å thick. Other dimensions may also be useful.

The top terminal may include a terminal contact (not shown) on its upper portion. The terminal contact, for example, is a metal silicide contact, such as nickel silicide. Other types of terminal contacts may also be useful. The terminal contact reduces resistance between the top terminal and the top terminal line.

Dielectric layers 105a-c may be provided to isolate the terminal lines and gate electrodes from each other. The dielectric layer, for example, may be silicon oxide. Other types of dielectric materials may also be useful. The different dielectric layers may be formed of the same dielectric material. However, it is understood that the different dielectric layers need not be formed of the same type of dielectric material.

As described, the lower gate is the SG and the upper gate is the MG. In such a case, the bottom terminal serves as a source of the transistor and the bottom terminal line serves as a common SL. The top terminal serves as a drain of the transistor while the top terminal line serves as a BL. Alternatively, the lower gate may be the MG and the upper gate may be the SG as shown in FIG. 2c. In such a case, the bottom terminal serves as a drain of the transistor and the bottom terminal serves as a BL. Isolation regions (not shown) are provided to isolate the bottom terminal lines in the substrate from each other. The top terminal serves as a source of the transistor while the top terminal line serves as a SL, which is not a common SL in this case.

An ML is coupled to the MG and a WL is coupled to the SG. The ML and WL are along a first or x direction. The ML and WL couple a plurality of bases along the first direction, forming a row of memory cells. The BL and SL are along a second or z direction. A BL couples a plurality of bases in the second direction, forming a column of memory cells. A plurality of BLs, MLs, WLs and SLs form a plurality of rows and columns of memory cells of an array. Other configurations of BLs, MLs, WLs and SLs may also be useful.

Figure 2D:
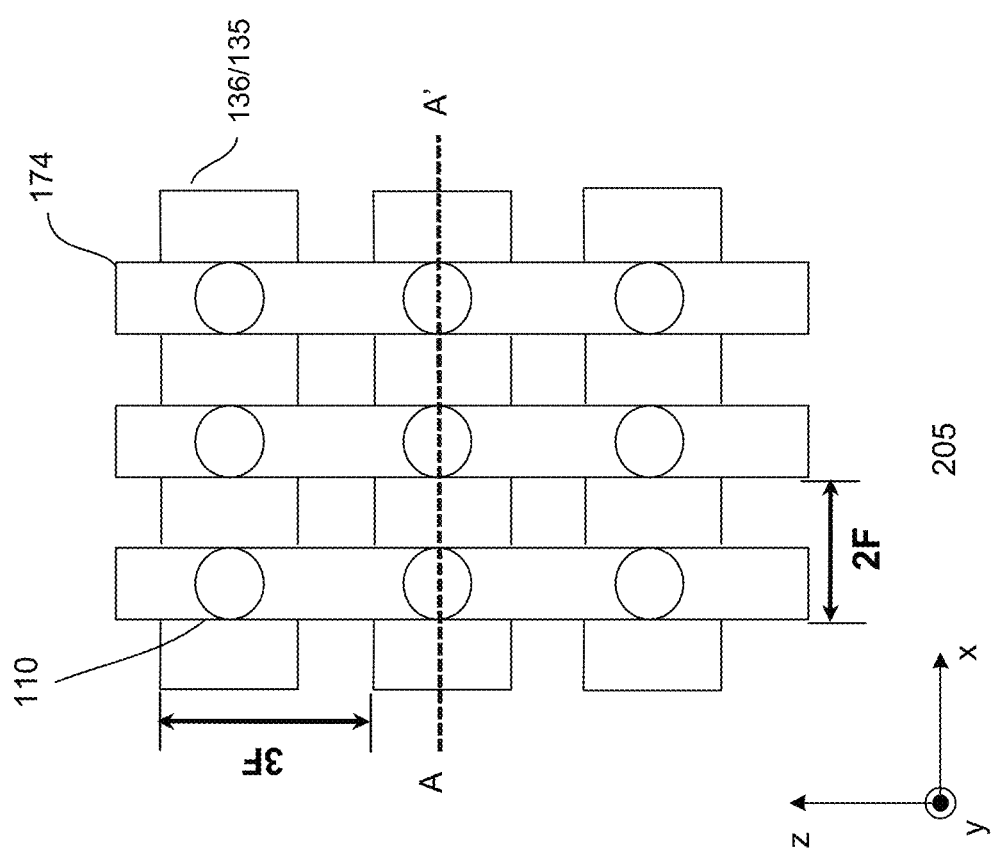
FIG. 2d-e show different views of a portion of an array.
Figure 2E:
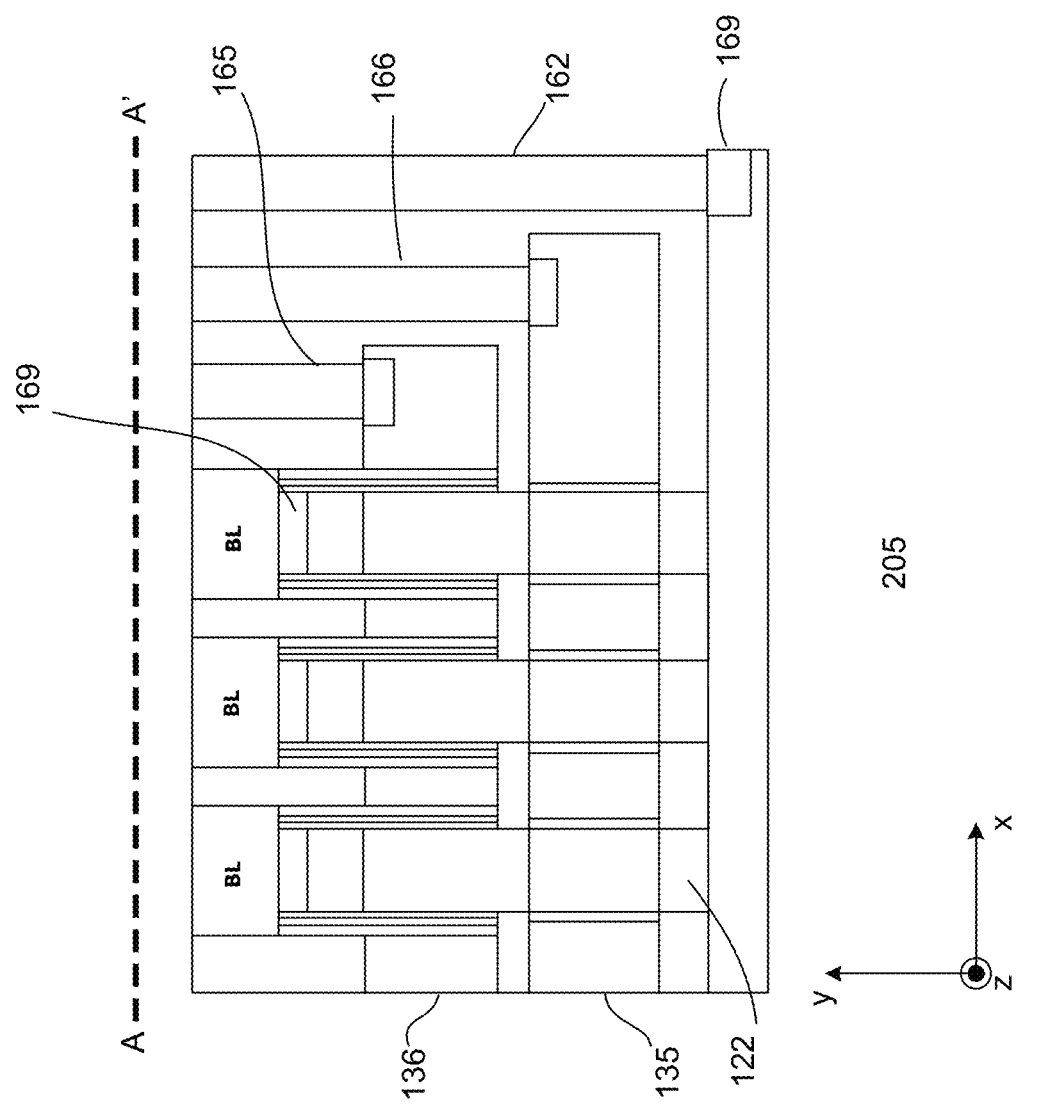

FIG. 2d shows a plan view of a portion of an array 205 and FIG. 2e shows a corresponding cross-sectional view along A-A'. As shown, the array includes memory cells 100, such as those described in FIG. 2a. In other embodiments, the array may include memory cells as described in FIG. 2b. Other types of memory cells may also be useful. Common elements may not be described or described in detail.

Bottom terminal lines 172 are coupled to the bottom terminals of the transistors while top terminal lines 174 are coupled to the top terminals of the transistors. The bottom and top terminal lines are disposed along the z direction. Top or bottom terminal lines serve as BLs and the other serve as SLs. Lower and upper gates 135 and 136 surrounding upper and lower channels on the bases are disposed along the same direction as the SLs. Upper or lower gates serve as SGs and the other serve as MGs. WLs are coupled to SGs and MLs are coupled to MGs. The ML and WL are disposed along the x direction. WLs and MLs are, for example, disposed in a metal level of the device above the memory cells and are coupled to the gates via contacts 165 and 166. Bottom terminal lines are coupled to, for example, select metal lines (SMLs) in a metal level above the memory cells by via contacts 162. The BLs form columns of memory cells in the array while the gates form rows of memory cells. The via contacts may be disposed at about the periphery of the array. To provide access to upper metal levels, the bottom terminal lines extend the farthest distance while the upper gates extend the least distance. Implant after contact/via etch may be performed on the bottom terminal line, lower gate and upper gate to reduce resistance of the via contacts. The dopant concentration may be about $10^{19}$-$10^{20}$ cm$^{-3}$. Other dopant concentrations may also be useful.

In one embodiment, the upper gates are MGs and the lower gates are SGs. In such a case, BLs are coupled to the top terminals and SLs are coupled to the bottom terminals. The BLs and SLs are disposed along the z direction. For the case where the lower gates are MGs and the upper gates are SGs, for example, as described in FIG. 2c, the BLs are coupled to the bottom terminals and the SLs are coupled to the top terminals. Isolation structures are provided to isolate the bottom terminals from each other in this case.

As illustrated, the width of the top terminal line and the bottom terminal lines equal to 1F, where F is equal to the feature size. This produces a unit cell size of about $6F^2$. As such, the present memory cell has a small cell size. Other cell layouts or cell/bit sizes may also be useful.

FIGS. 3a-h show cross-sectional views of an embodiment of a process 300 for forming a memory cell. The memory cell, for example, is a part of a memory device. In other embodiment, the memory cell is a part of an IC device. The memory cell, for example, is similar to that described in FIG. 1a. Common elements may not be described or described in detail.

Figure 3A:
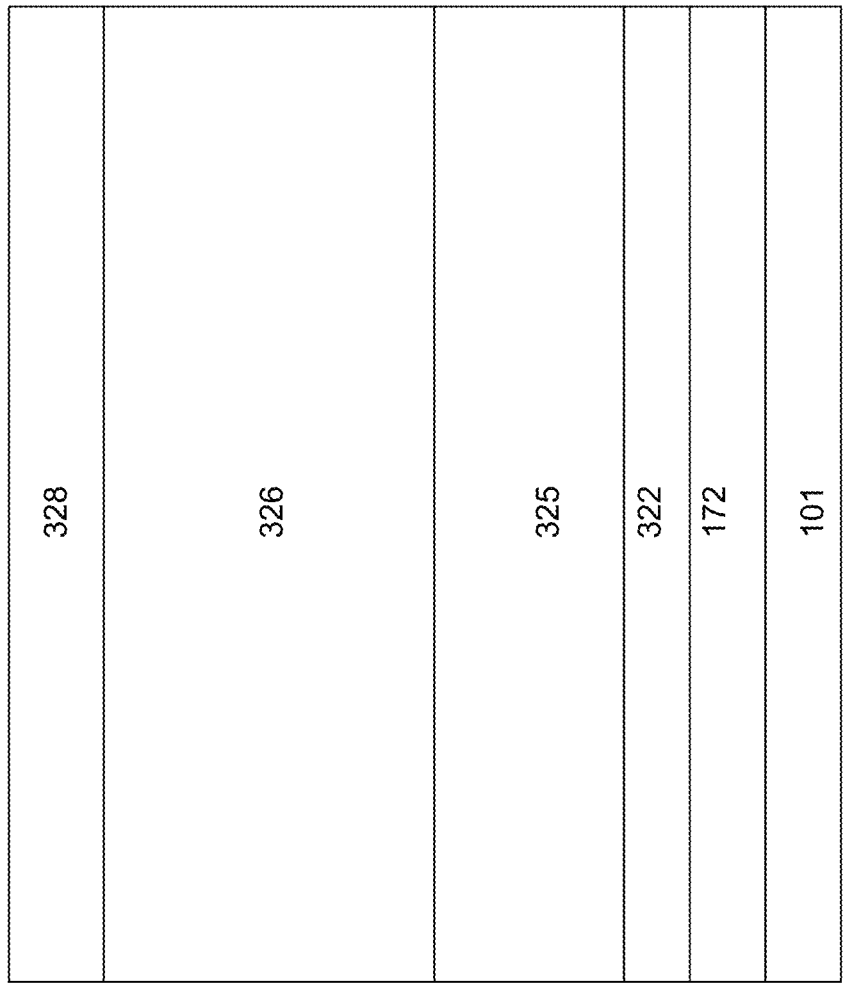
FIGS. 3a-h show cross-sectional views of an embodiment of a process 300 for forming memory cells.
Figure 3A:
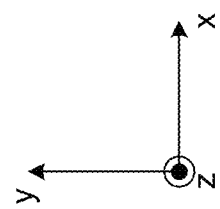

Referring to FIG. 3a, a substrate 101 is provided. The substrate can include a silicon substrate, such as lightly p-type doped substrate. Other types of substrates, including silicon germanium or silicon-on-insulator (SOI), may also be useful.

The substrate is prepared with an array region containing memory cells. In one embodiment, the memory cells include non-volatile memory cells. Other types of memory cells are also useful. The array region includes a doped well (not shown) with dopants of a second polarity type. The doped wells may be intermediately or heavily doped wells. The second polarity type can be n-type or p-type, depending on the memory cell type. The second polarity type wells are used for first polarity type memory cells. For example, n-type wells are used for p-type memory cells while p-type wells are used for n-type memory cells.

Additionally, the substrate may include a logic region (not shown) for support circuitry. The substrate may also include regions for other types of circuitry, depending on the type of device or IC. The different device regions may be isolated from each other by isolation regions (not shown). For example, the device regions may be isolated from each other by shallow trench isolation (STI) regions. Other types of isolation regions may also be useful.

An implant is performed. In one embodiment, the implant forms a doped bottom terminal line 172 in the substrate. The doped terminal line, for example, may be formed by blanket doping to the substrate before isolation region formation. The bottom terminal line may be disposed along a first direction. For example, the bottom terminal line may be disposed along the z direction. The bottom terminal line is heavily doped with first polarity type dopants. For example, the dopant concentration of the bottom terminal line may be about $10^{19}$-$10^{20}$ cm$^{-3}$. In one embodiment, the first polarity type is n-type. Providing p-type as the first polarity type may also be useful. The bottom terminal line may be about 500 Å thick and a width of about 1F, where F is the feature size. Providing the bottom terminal line having other dimensions may also be useful.

In one embodiment, a base stack is deposited over the substrate. The base stack includes various layers of a base. For example, the base stack includes semiconductor layers of the channels and the top and bottom terminals. Other configurations of the base stack may also be useful. The various layers of the base stack may be formed by epitaxial growth. Other techniques for forming the base stack layers may also be useful.

In one embodiment, the base stack includes a lower channel layer 325, an upper channel layer 326 and top and bottom terminal layers 328 and 322. The top and bottom terminal layers may be heavily doped with first polarity type dopants. The dopant concentration, for example, may be about $10^{19}$-$10^{20}$ cm$^{-3}$. Other dopant concentrations may also be useful. In one embodiment, the terminal layers may be doped by insitu doping during deposition. Other techniques for doping the terminal layers may also be useful.

As shown, the lower channel layer serves as a SG channel layer and the upper channel layer serves as a MG channel layer. For example, the lower channel layer is a first channel layer and the upper channel is a second channel layer. Other configurations of the base stack may also be useful.

In one embodiment, the SG and MG channel layers are formed of different types of crystalline semiconductor materials, forming heterogeneous channel layers. For example, the SG channel layer is formed of a first crystalline semiconductor material and the MG channel layer is formed of a second semiconductor material. The terminal layers, in one embodiment, are formed of a terminal crystalline semiconductor material. The terminal crystalline material may be the same as the first semiconductor crystalline material. Providing terminal materials different from the first semiconductor material may also be useful.

In one embodiment, the first semiconductor material of the SG channel layer has a higher band gap than the second semiconductor material for the MG channel layer. In one embodiment, the first semiconductor material is Si and the second semiconductor material is SiGe. In one embodiment, the terminal layers are formed of the same material as the first semiconductor material. For example, the terminal layers are formed of Si. Other configurations of first, second and terminal semiconductor materials may also be useful.

Figure 3B:
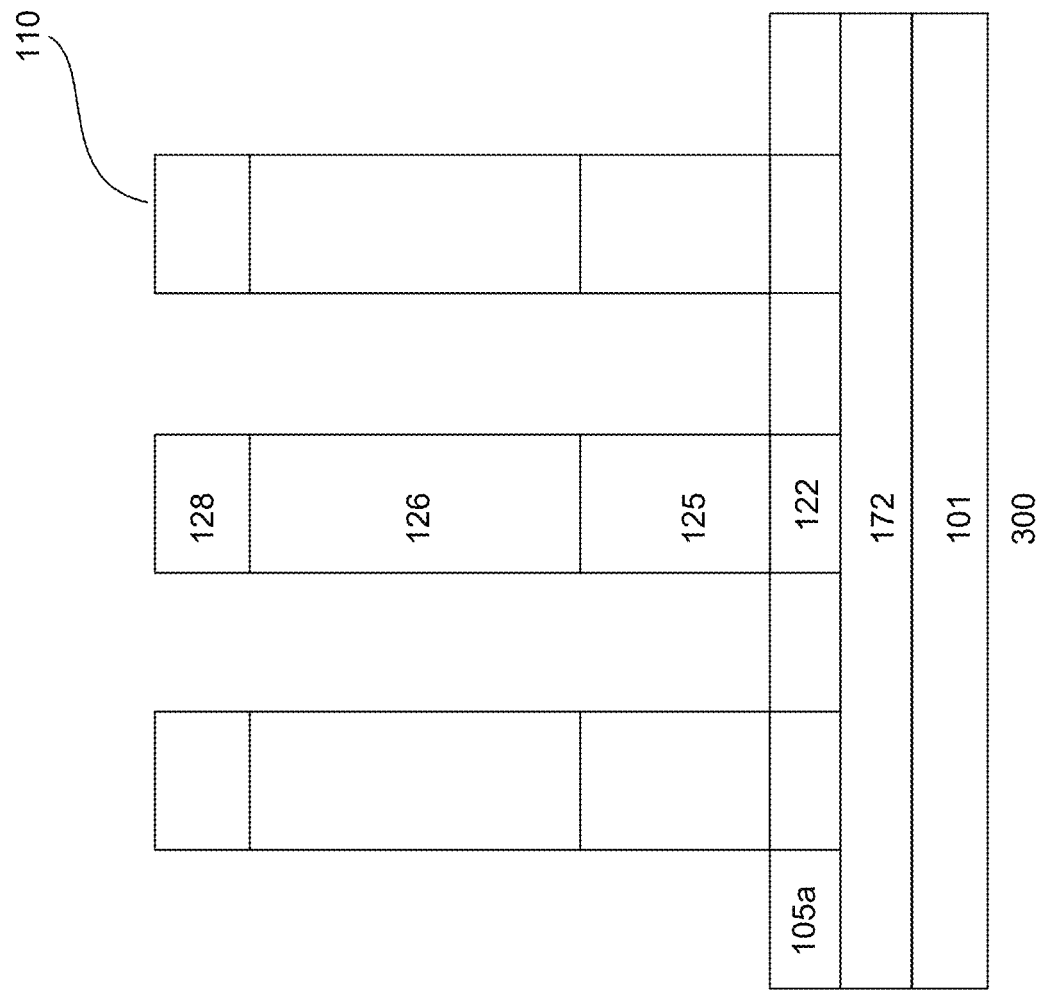

As illustrated in FIG. 3b, the base stack is patterned. In one embodiment, the base stack is patterned to form or define nanowire bases 110 for transistors. Patterning the base stack, for example, may employ a patterned hard mask (not shown) on the base stack. The patterned hard mask serves as an etch mask for an anisotropic etch, such as RIE. A hard mask layer including, for example, silicon oxide may be provided on the base stack. Other types of hard mask layers, such as silicon nitride, may also be useful. The hard mask layer is patterned using a soft mask, such as photoresist, which is exposed with the desired pattern through a photomask. To improve lithographic resolution, an anti-reflective coating (ARC) can be provided beneath the photoresist. The pattern of the photomask is transferred to the soft mask after development. The pattern of the soft mask is transferred to the hard mask by, for example, an anisotropic etch such as reactive ion etch (RIE). The patterned hard mask protects portions of the base stack corresponding to the bases. Exposed portions of the base stack are removed using, for example, by RIE, leaving bases on the substrate. In other embodiments, a soft mask is used to pattern the base stack.

A nanowire base includes channel regions 125 and 126 between top and bottom terminals 128 and 122. The cross-sectional shape of a base may be circular, having a dimension of about 1F. Other shapes or dimensions may also be useful.

After the nanowire bases are formed, a dielectric layer is formed on the substrate. The dielectric layer, for example, may be silicon oxide. Other types of dielectric materials, such as SiCOH, may also be useful. The dielectric layer fills the gaps between the bases. Excess dielectric material over the top of the top terminal may be removed by, for example, a planarizing process, such as chemical mechanical polishing (CMP). The planarizing process forms a planar surface between the dielectric layer and top of the bases. An etch back process is performed to recess the dielectric material to about the top of the bottom terminals, leaving dielectric layer 105a separating the bottom terminals. The etch back process, for example, may be dry etch or wet etch.

Figure 3C:
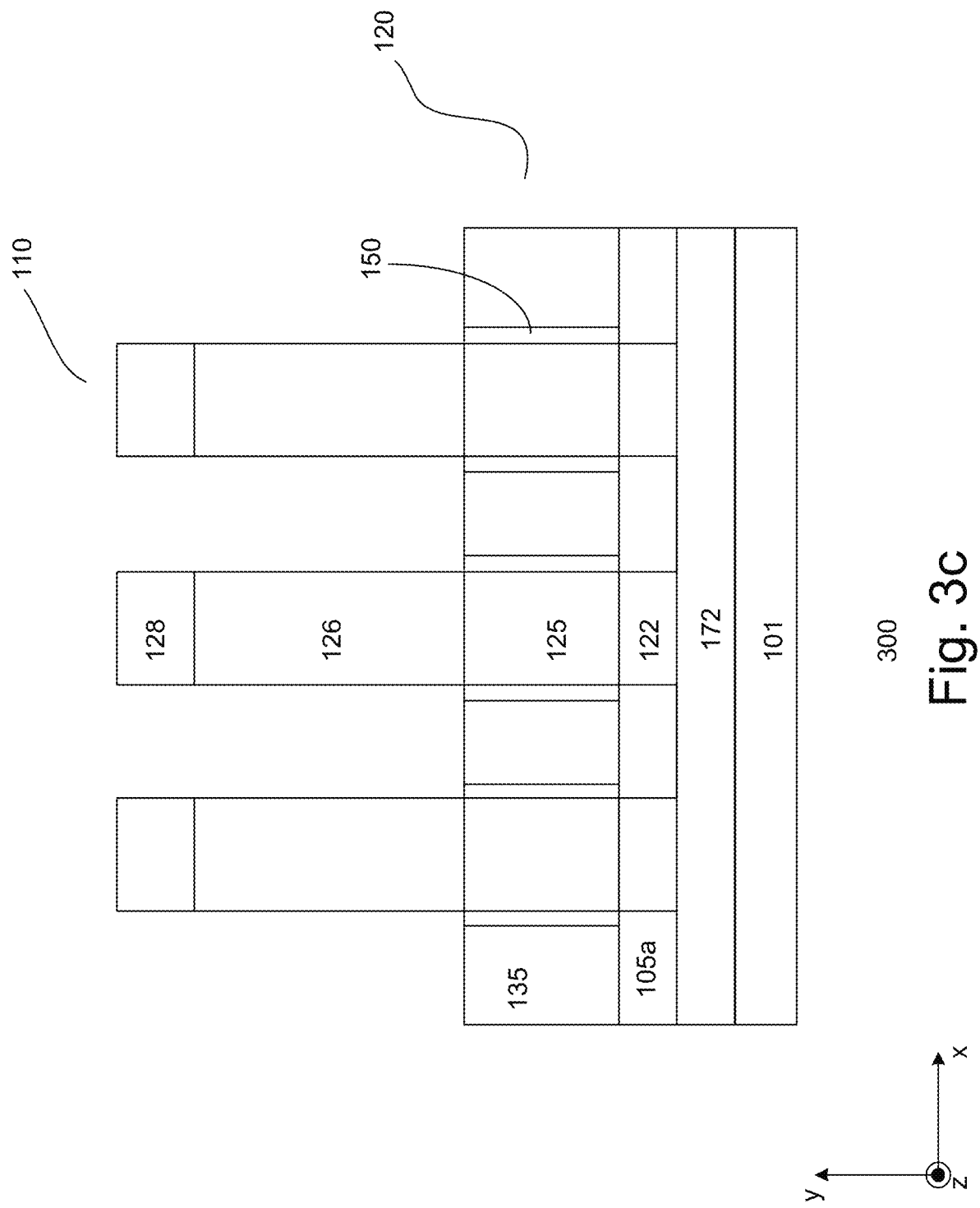

Referring to FIG. 3c, lower gates 120 surrounding first channel regions of the bases are formed. In one embodiment, the lower gates serve as SGs. A lower gate or SG includes a lower gate or SG electrode 135 over a lower gate or SG dielectric 150. The lower gate dielectric surrounds the first channel region of a base while the lower gate electrode covers the lower gate dielectric. The SG gate electrode, for example, is a common gate electrode of a row of bases along the first direction. For example, the SG gate electrode is a common SG electrode for a row of bases in the x direction. The SG gate dielectrics may be silicon oxide and the SG gate electrodes may be polysilicon. The SG gate electrodes may be a doped polysilicon. For example, the SG gate electrode may be doped with n-type dopants for n-type transistor or doped with p-type dopants for p-type transistor. Other types of gate dielectrics and/or gate electrodes may also be useful.

To form the lower gates, lower gate dielectrics are formed. The first gate dielectrics may be formed by, in one embodiment, thermal oxidation. For example, thermal oxide layer lines the crystalline bases and crystalline substrate. Other techniques for forming the first gate dielectrics or other types of first gate dielectrics may also be useful. An anisotropic etch, such as RIE, may be performed to remove horizontal portions of the gate dielectric from the top of the bases and substrate, leaving the first gate dielectrics lining sides of the bases.

A SG electrode layer is deposited on the substrate after forming the SG dielectric. For example, a polysilicon layer is deposited by chemical vapor deposition (CVD). The gate electrode layer fills the gaps between and covers the bases. Other techniques for forming the first gate electrode layer or other types of SG electrode layers may also be useful. Excess gate electrode material over the top of the bases may be removed by, for example, a planarizing process, such as CMP.

The planarizing process forms a planar surface between the gate electrode layer and top of the bases.

The gate electrode layer is patterned to define gates. In one embodiment, the gate electrode layer is patterned by an anisotropic etch, such as RIE, using an etch mask, such as photoresist, to define the gates. Other techniques for patterning the gate electrode layer may also be useful. The etch, for example, stops on the dielectric layer isolating the bottom terminals. As discussed, the gates are disposed along the x direction, forming common gates for different rows of bases. The etch mask is removed after patterning the gate electrode materials.

An etch back process is performed to recess the gate electrode layer. The etch back process, for example, may be a dry etch. In one embodiment, the gate electrode layer is recessed to about the top of the lower channel, forming lower gates. This leaves the SG dielectric layer on the bases above the SGs exposed. The exposed portions of the SG gate dielectric layer are removed by, for example, a wet etch. The wet etch, for example, is selective to gate electrode layer and bases. This completes the formation of the lower gates. The lower gates serve as SGs of memory cells.

Figure 3D:
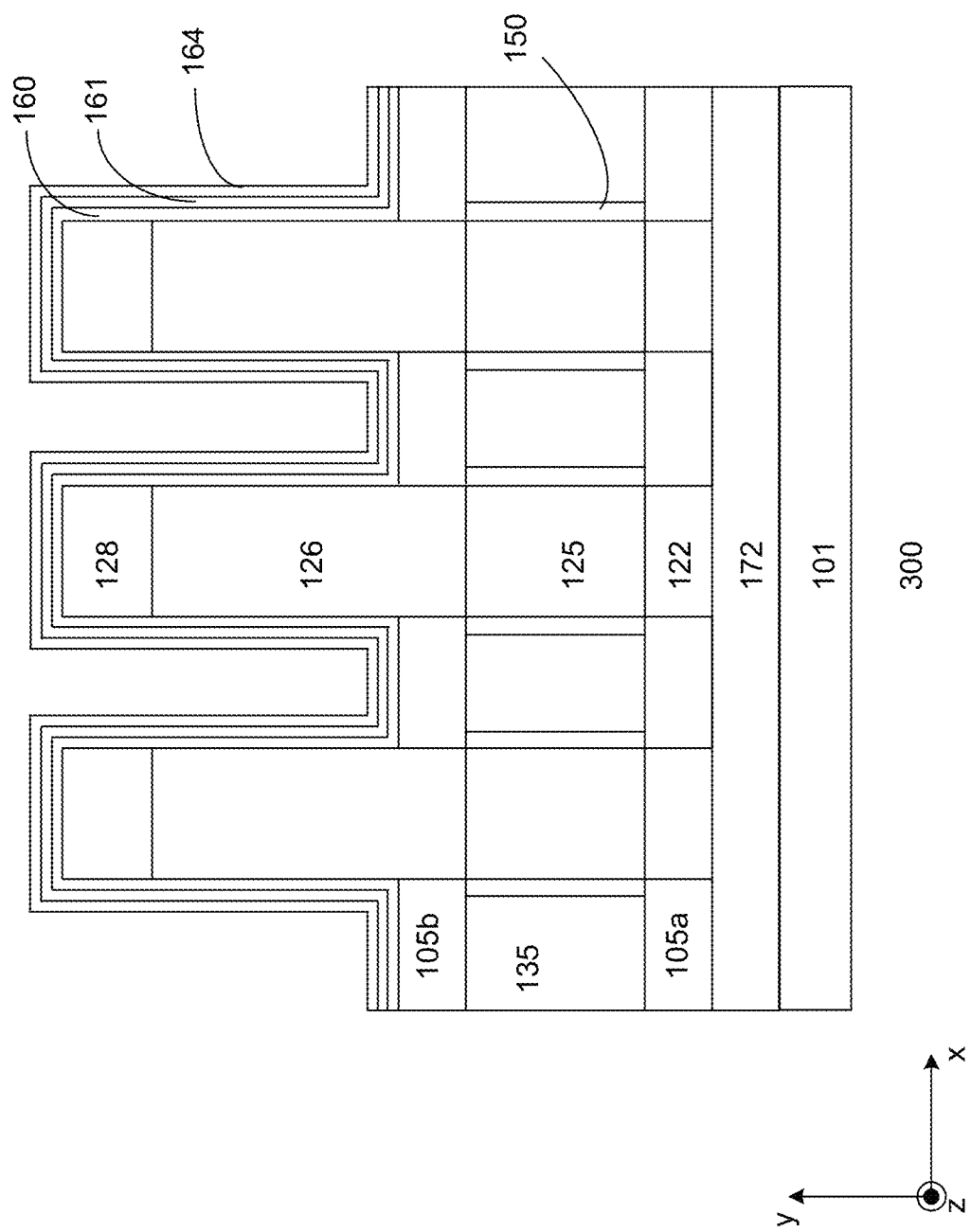

As illustrated in FIG. 3d, a dielectric layer is formed on the substrate. The dielectric layer, for example, may be silicon oxide. Other types of dielectric materials, such as SiCOH, may also be useful. The dielectric layer fills the gaps between the first gates, bases as well as covering the top of the bases. Excess dielectric material over the top of the bases may be removed by, for example, a planarizing process, such as CMP. The planarizing process forms a planar surface between the dielectric layer and top of the bases. An etch back process is performed to recess the dielectric material to about the top of the isolation portion of the bases, leaving an inter-gate dielectric layer 105b over the first gates. The etch back process, for example, may be a dry etch. Other types of etch back processes may also be useful.

An upper gate dielectric layer is formed over the substrate. In one embodiment, the upper gate dielectric layer is a charge storage layer. For example, the upper gate dielectric layer is a charge storage layer of a MG. The upper gate dielectric layer lines the base and top of the inter-gate dielectric layer 105b. In one embodiment, the upper gate dielectric layer is a dielectric stack. The dielectric stack, for example, may include a first oxide layer 160 and a nitride layer 161. The first oxide layer may serve as a tunneling layer and the nitride layer may serve as a charge storage layer. In one embodiment, the dielectric stack includes a sacrificial layer 164 provided over the nitride layer. The sacrificial layer, for example, may be silicon oxide. Other types of sacrificial layers may also be useful. Various techniques may be employed to form the dielectric stack. For example, the first oxide layer may be formed by thermal oxidation while the nitride and sacrificial layer may be formed by CVD. The thickness of the first oxide layer may be about 50 Å, the thickness of the nitride layer 161 may be about 70 Å, and the thickness of the sacrificial layer may be about 70 Å. Other thicknesses and techniques or combinations of techniques may be employed to form the dielectric stack.

Figure 3E:
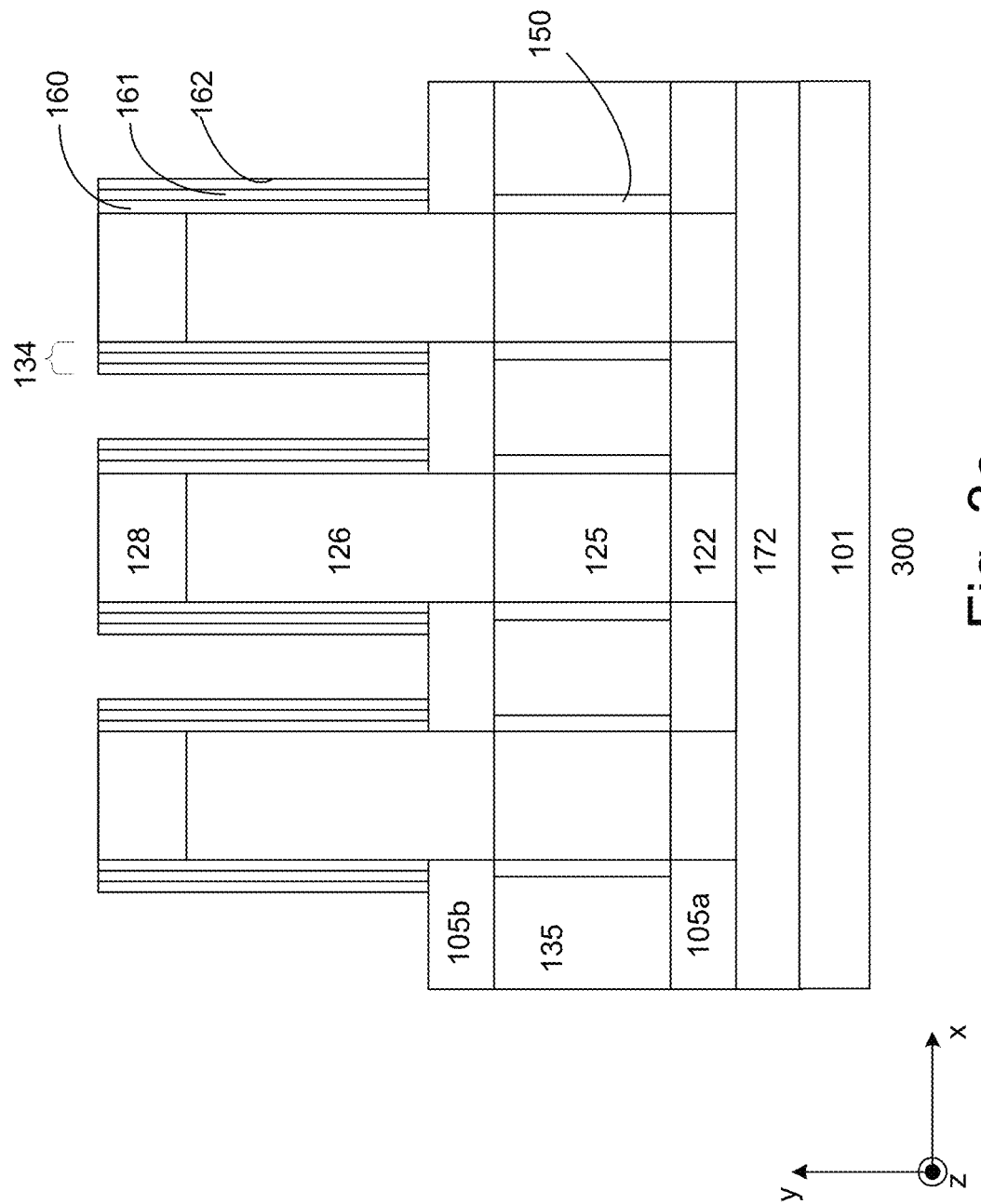

As shown in FIG. 3e, the dielectric stack is patterned. For example, the dielectric stack is anisotropically etched, such as by RIE, to remove horizontal portions, leaving non-horizontal portions on sidewalls of the bases. The sacrificial layer, for example, protects sidewalls of the dielectric stack, in particular, during the removal of the horizontal portions of the dielectric stack. After patterning the dielectric stack, the sacrificial layer is removed. The sacrificial layer may be removed by, for example, an isotropic etch, such as a wet etch. The wet etch is selective to the nitride layer.

A dielectric layer may be formed over the substrate. The dielectric layer, in one embodiment, is a second oxide layer 162. The dielectric layer may be formed by, for example, CVD with a thickness of about 70 Å. Other types of dielectric materials, thicknesses or forming techniques may also be useful. The second oxide layer over the ON stack forms an ONO storage stack 134. The second oxide layer may serve as a blocking layer. Other configurations or types of charge storage layers may also be useful.

Figure 3F:
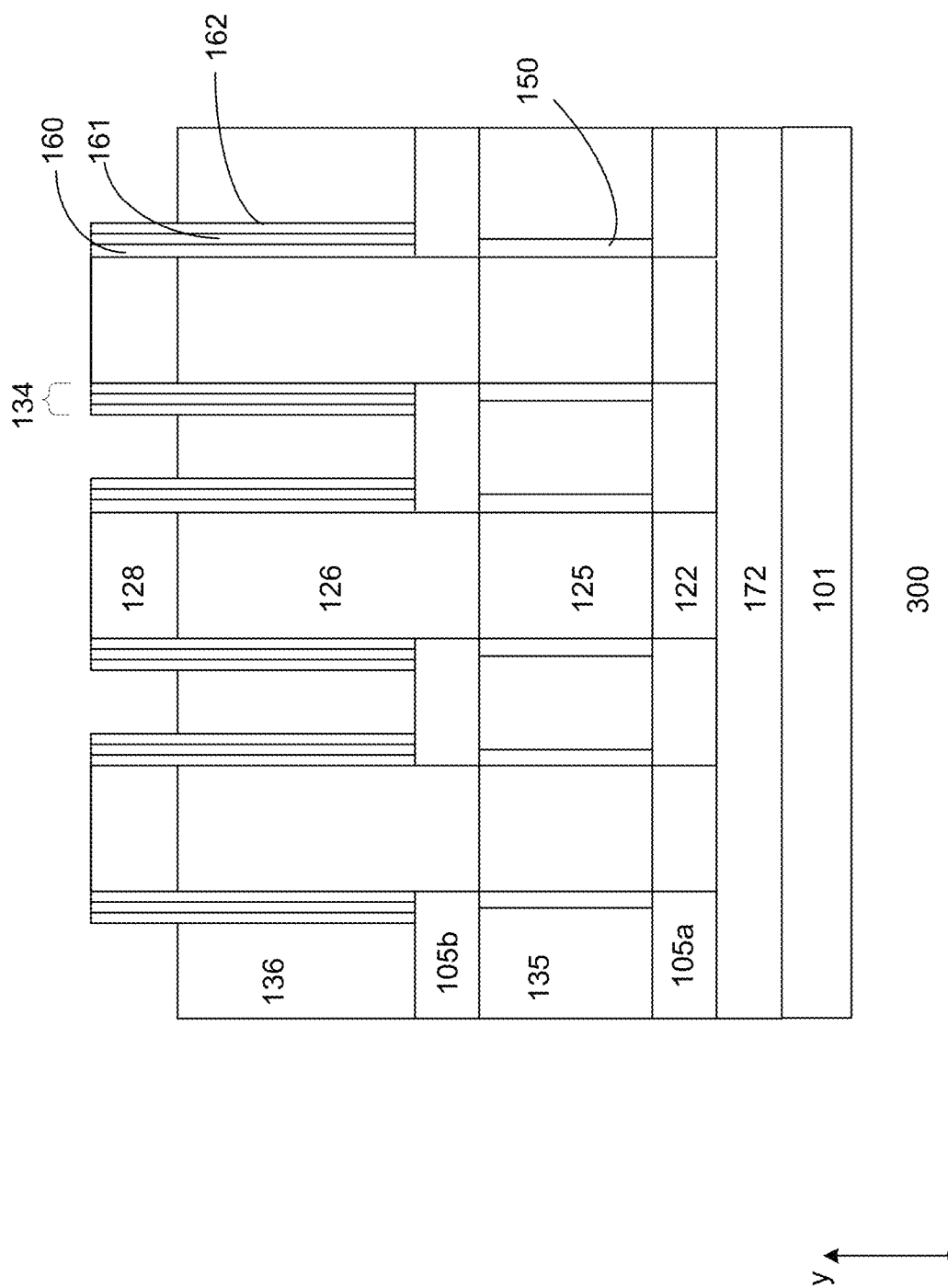

Referring to FIG. 3f, upper gate electrodes 136 are formed. The upper gate electrodes, for example, may be polysilicon. The upper gate electrode may be a doped polysilicon. For example, the upper gate electrode may be doped with n-type dopants for n-type transistor or doped with p-type dopants for p-type transistor. The upper gate electrode may be formed in a similar manner as the lower gate electrode. For example, an upper gate electrode layer may be deposited on the substrate by CVD followed by CMP to form a planar top surface with the bases. The gate electrode layer is patterned by RIE with an etch mask to define the upper gates. The gates, for example, are disposed along the x direction to form common gates for rows of bases. After removing the etch mask, the gates are recess by an etch back process to define the upper gate electrodes. The gates are recessed to about the top of the upper channels. Exposed portions of the upper gate dielectric need not be removed. For example, the upper gate dielectric may remain to cover the sides of the top terminals. The upper gates serve as MGs of memory cells.

Figure 3G:
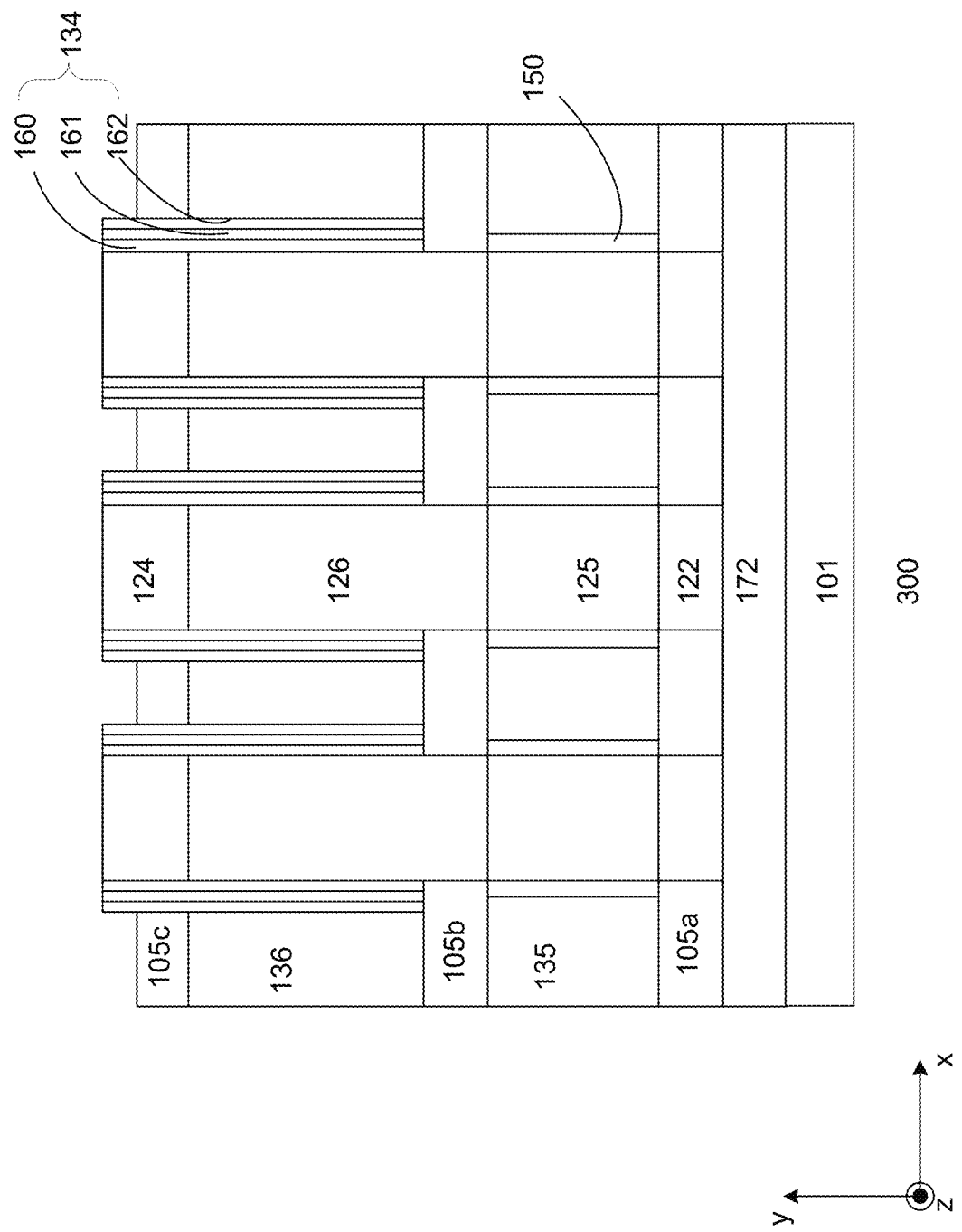

Referring to FIG. 3g, a dielectric layer is formed on the substrate. The dielectric layer, for example, may be silicon oxide. Other types of dielectric materials, such as SiCOH, may also be useful. The dielectric layer fills the gaps between the second gates, bases as well as covering the top of the bases. Excess dielectric material and horizontal portion of the second oxide layer (not shown) over the top of the bases may be removed by, for example, a planarizing process, such as CMP. The planarizing process forms a planar surface between the dielectric layer and top of the bases, forming, for example, a top inter-terminal dielectric 105c isolating the top terminals. A wet or dry etch process may be performed to recess the dielectric material below the top of the bases, leaving an isolation layer 105c over the second gates.

In the case where the top terminal layer is an intrinsic or undoped layer, an implant is performed. In the case where the hard mask is present over the crystalline stack, the hard mask may be removed before the implant is performed. An implant mask, such as photoresist, may be employed. The implant, for example, dopes the top terminal layer on the bases with first polarity type dopants to form top terminals 124. In one embodiment, the top terminal layer is heavily doped with first polarity type dopants. The dopant concentration, for example, may be about $10^{19}$-$10^{20}$ cm$^{-3}$. Other dopant concentrations may also be useful. The implant mask is removed after forming the top terminals.

Figure 3H:
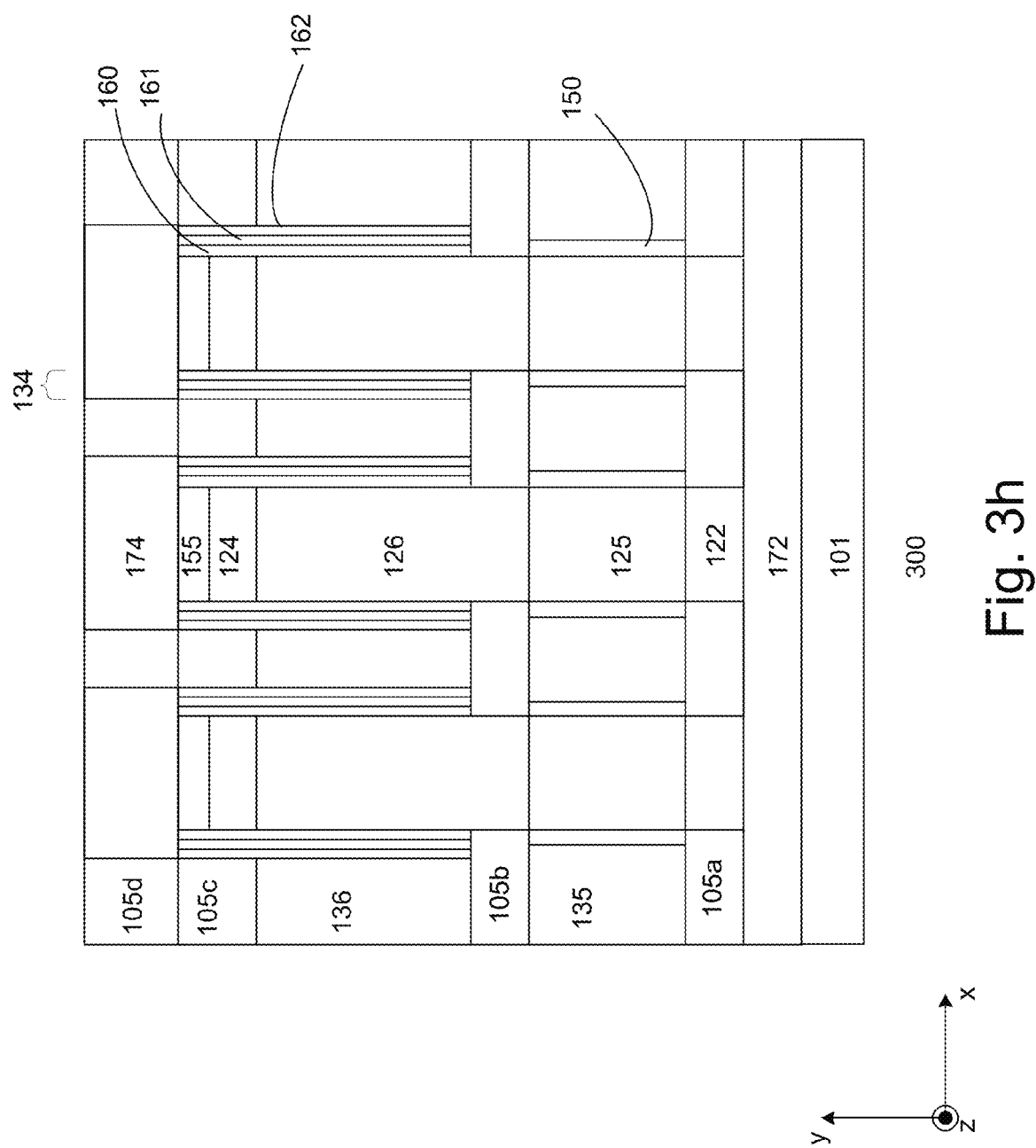

In FIG. 3h, metal silicide contacts 155 are formed on the top terminals 124. For example, the nickel silicide contacts are formed on the top terminals. Other types of metal silicide contacts may also be useful. The thickness of the contacts may be about 300 Å. Providing other thicknesses may also be useful.

To form the salicide contacts, a metal layer is deposited on the surface of the substrate. The metal layer, for example, may be nickel or an alloy thereof. Other types of metallic layers, such as cobalt, or alloys thereof, including nickel, may also be used. The metal layer can be formed by Physical Vapor Deposition (PVD). Other types of metal elements and/or be formed by other types of processes can also be useful.

An anneal is performed, causing a reaction with the metal layer and top terminals, forming a silicided layer. The anneal, for example, is performed at a temperature of about 400-500 C. for about 10 sec. Unreacted metal in the silicidation process is removed by, for example, a wet removal process. For example, unreacted metallic material is removed selective to the salicide contacts. The annealing process may be a rapid thermal anneal (RTA). Other annealing parameters or techniques may also be useful to form the salicide contacts.

Top terminal lines 174 are formed over the base. The top terminal lines, in one embodiment, are disposed in the second direction. For example, the top terminal lines are disposed in the z direction. The first and second directions may be orthogonal. The top terminal lines, for example, is a common line connecting top terminals of bases in the second direction. For example, a top terminal line couples a column of bases. To form the top terminal lines, a damascene process may be employed. For example, an inter-line dielectric layer 105d is formed on the substrate over the bases and inter-terminal dielectric layer 105c. The inter-line dielectric layer, for example, may be silicon oxide. Other types of dielectric materials, such as TEOS or SiCOH, may also be useful. The inter-line dielectric layer is patterned to form trenches corresponding to the top terminal lines. The inter-line dielectric layer may be patterned using a patterned soft mask, such as photoresist. The trenches are filled with a conductive material, such as copper or copper alloy. Other types of conductive materials may also be useful. Excess conductive material is removed by, for example, CMP, forming top terminal lines. Other techniques for forming top terminal lines may also be useful. In one embodiment, the top terminal line is a first metal level (e.g., M1) of a device.

As described, the lower gates are the SGs and the upper gates are the MGs. In such a case, the bottom terminals serve as sources of the transistors and the bottom terminal line serves as a common SL. The top terminals serve as drains of the transistors while the top terminal lines serve as BLs. Alternatively, the lower gates may be the MGs and the upper gates may be the SGs. In such a case, the bottom terminals serve as drains of transistor and the bottom terminal lines serve as BLs, of which isolation regions (not shown) are provided to isolate each BL. The top terminal serves as a source of the transistors while the top terminal lines serve as SLs.

MLs are coupled to MGs and WLs are coupled to SGs. The MLs and WLs are along a first or x direction. The MLs and WLs couple a plurality of bases along the first direction to form rows of memory cells while BLs and SLs are along a second or z direction couple a plurality of bases in the second direction to form columns of memory cells, forming a memory array. Other configurations of BLs, MLs, WLs and SLs may also be useful.

As described, the lower channel layer serves as a SG channel layer and the upper channel layer serves as a MG channel layer. Other configurations of the base stack may also be useful. For example, the lower channel layer serves as a MG channel layer and the upper channel layer serves as a SG channel layer. For example, the lower channel layer is a second channel layer and the upper channel is a first channel layer. In such case, isolation regions (not shown) are provided to isolate the bottom terminal lines. Various suitable methods may be used to isolate the bottom terminal lines. For example, implantation is performed on the substrate after forming the nanowire bases. The regions of the substrate not covered by the nanowire bases will be implanted with dopants, thus forming doped regions isolating the bottom terminal lines. This method avoids the use of a photomask since the nanowire bases are provided with hard mask. In another example, blanket implant may be performed to form a first type well for a second type transistor and then implant second type dopants using a photomask to form doped regions so that the first type well is used as isolation region. Alternatively, isolation regions, such as STIs, may be formed first, followed by formations of first type well and second type doped regions.

Figure 4A:
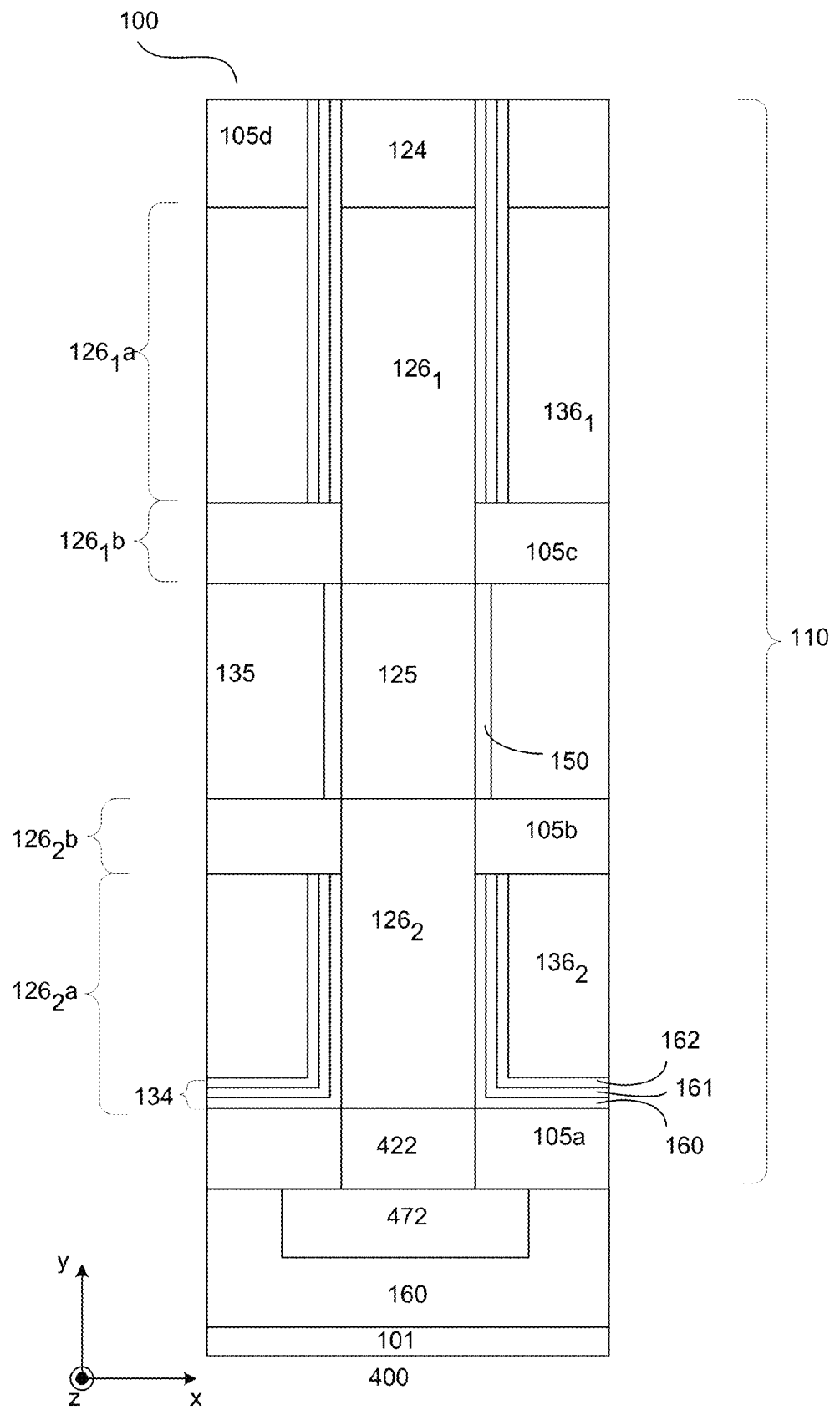
FIGS. 4a-b show a portion 400 of other embodiments of a device or IC.
Figure 4B:
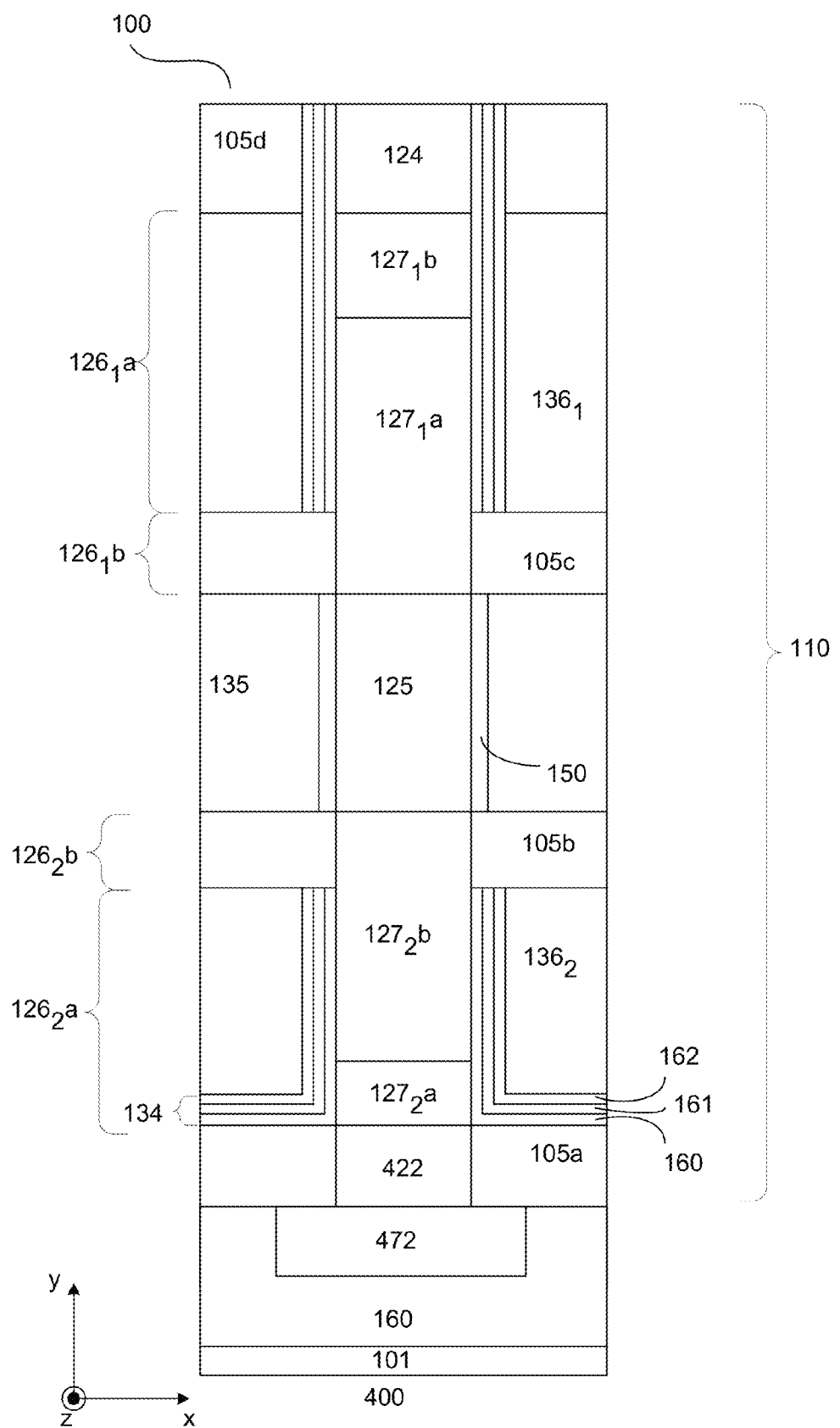

FIGS. 4a-b show cross-sectional views of a portion 400 of other embodiments of a device or IC. The portion of the device includes a cell region on which a memory cell 100 is formed. The cell region, for example, is part of an array region having a plurality of cell regions. The substrate may include other types of device regions. For example, the substrate may include a support region for devices for accessing the memory array. Additional device regions, such as logic regions, may also be provided. The substrate may include regions for other types of circuitry, depending on the type of device or IC.

The substrate, for example, is a semiconductor substrate, such as a silicon substrate. For example, the substrate may be a lightly doped p-type substrate. Providing an intrinsic or other types of substrates may also be useful. The memory cell may be a NVM memory cell. Other types of memory cells may also be useful. The memory cell is a multi-bit memory cell. In one embodiment, the memory cell is a dual-bit memory cell, such as that described in FIG. 1d. The memory cell may include similar features as that described in FIGS. 2a-b. Common elements may not be described or described in detail.

The memory cell includes a transistor. The transistor is formed in the cell region on a substrate 101. The cell region includes a doped well 160 with second polarity type dopants. The doped well may be intermediately doped. For example, the dopant concentration of the doped well may be about $10^{15}$-$10^{17}$ cm$^{-3}$. Other dopant concentrations may also be useful. The doped well, for example, may be an array doped well in the array region.

A bottom terminal line 472 is disposed in the doped well. In one embodiment, the bottom terminal line is disposed along the first direction. For example, the terminal line may be disposed along the z direction. Providing other first directions may also be useful. In one embodiment, the bottom terminal line is heavily doped with first polarity type dopants. For example, the substrate may be heavily doped with first polarity type dopants to form the bottom terminal line. The dopant concentration of the bottom terminal line may be about $10^{19}$-$10^{20}$ cm$^{-3}$. Other dopant concentrations for the bottom terminal line may also be useful.

A base 110 of the transistor is disposed on the substrate. The base, in one embodiment, is a nanowire base. The nanowire may have a circular cross-sectional shape. The cross-sectional dimension of the nanowire, for example, may be about 1F. Other cross-sectional shapes or dimensions may also be useful. Other types of bases may also be useful. In one embodiment, the base is a vertical base. For example, the base may be disposed on the substrate along the y direction.

The base includes bottom and top memory terminals 422 and 124 disposed at ends of the base. The bottom terminal is disposed on the substrate in contact with the bottom terminal line. The terminals are heavily doped regions with first polarity type dopants. The dopant concentration of the terminals may be about $10^{20}$ cm$^{-3}$. Other dopant concentrations may also be useful.

The portion of the base between the terminals serves as a body for the transistor. In one embodiment, the body includes an intermediate channel region 125 between first and second channel regions $126_{1-2}$. The first channel region is disposed adjacent to the top terminal and the second channel region is disposed adjacent to the bottom terminal. The first and second channel regions serve as channels for first and second gates $136_{1-2}$ and the intermediate channel region serves as the channel for an intermediate gate 135. The various gates form a split gate of the transistor. In one embodiment, the first and second gates are first and second MGs and the intermediate gate is a SG.

The channels are vertical channels. The intermediate, first and second channels are disposed along a direction perpendicular to the plane of the substrate surface. For example, the channels are along the y direction. A height of the channel is equal to its channel length. In one embodiment, the SG channel length is about 100 nm, the first MG channel length is about 100 nm and the second MG channel length is about 100 nm. As shown, an MG channel region of the base includes an MG channel 126a as well as a channel buffer portion 126b which separates an MG from the SG. For example, the channel buffer portions of the MG channels are disposed adjacent to the SG. The height of the channel buffer portion, for example, is about 10 nm. The height of the channel buffer portion should be sufficiently thin to form a split gate structure of MG and SG. Other configurations and dimensions of the channel regions may also be useful.

The base includes different types of crystalline semiconductor materials, forming a heterogeneous base. In one embodiment, the first and second channel regions are formed of a crystalline semiconductor material different than the intermediate channel, forming heterogeneous channels. Preferably, the MG channels are the same but different than the intermediate channel. For example, the intermediate channel is formed of a first semiconductor material and the first and second channels are formed of a second crystalline semiconductor material. The terminal portions are formed of a terminal crystalline semiconductor material. The terminal crystalline material may be the same as the first crystalline semiconductor material. Providing terminal materials different from the first semiconductor material may also be useful.

In one embodiment, the first semiconductor material for the channel of the SG has a higher band gap than the second semiconductor material for the channel of the MGs. In one embodiment, the first semiconductor material is Si and the second semiconductor material is SiGe. In one embodiment, the terminal portions are formed of Si. Other configurations of the channels and terminals may also be useful.

In another embodiment, as shown in FIG. 4b, an MG channel region is a heterogeneous channel region. For example, an MG channel region includes a main portion 127a with the second crystalline material and a secondary portion 127b with a third crystalline material. The third crystalline material, in one embodiment, is the same as the first crystalline material. For example, the main portion may include SiGe and the secondary portion may include Si. Other configurations of the first and second channel regions may also be useful.

The SG and MGs surround the intermediate and first and second channels, forming a gate-all-around transistor. The SG includes an intermediate gate electrode 135 over an intermediate gate dielectric 150. The intermediate gate dielectric lines the intermediate channel of the base. The intermediate gate dielectric may be silicon oxide. For example, the intermediate gate dielectric may be thermal oxide. The thickness of the intermediate gate dielectric may be about 20 Å. Other types of gate dielectric or dimensions may also be useful. As for the MGs, they each include a MG electrode 136 over a MG dielectric 134. The MG gate dielectric serves as a charge storage dielectric. The charge storage dielectric may be a dielectric stack. For example, the charge storage dielectric may be an oxide-nitride-oxide (ONO) stack with first and second oxide layers 160 and 162 sandwiching a nitride layer 161. The first oxide layer may be about 5 nm thick, the second oxide layer may be about 7 nm thick and the nitride layer may be about 7 nm thick. Other types of charge storage dielectrics or dimensions may also be useful. As for the SG and MG gate electrodes, they may be polysilicon. The thickness of the gate surrounding the base may be about 100 nm. Other types of gate electrodes or dimensions may also be useful. It is understood that the gate electrodes may be formed of the same material or different materials. The gate electrodes may extend along a second direction parallel to the substrate surface or horizontally. For example, the gate electrodes may extend in the x direction. Providing other second directions may also be useful. The first and second direction may be orthogonal. Non-orthogonal first and second directions may also be useful.

A top terminal line 174 (not shown) is disposed over the base coupled to the terminal on top end of the base. The top terminal line, in one embodiment, is along the first direction. For example, the top terminal line is along the z direction.

Dielectric layers 105a-d are provided to isolate the terminal lines and gate electrodes from each other. The dielectric layer, for example, may be silicon oxide. Other types of dielectric materials may also be useful. The dielectric layers may be formed of the same dielectric material. However, it is understood that the different dielectric layers need not be formed of the same type of dielectric material.

In some embodiments, isolation regions may be provided to isolate the bottom terminal lines in the substrate from each other. For example, the isolation regions may be shallow trench isolation regions (STIs).

The top and bottom terminal lines serve as first and second BLs coupled to the dual-bit memory. The first and second gates are MGs coupled to first and second MLs while the intermediate gate is a SG coupled to a WL. The first and second BLs coupled a plurality of memory cells in the first direction, forming a column of cells of an array while the MGs and SGs form rows of cells in the array. The array includes a plurality of rows and columns of cells.

Figure 4D:
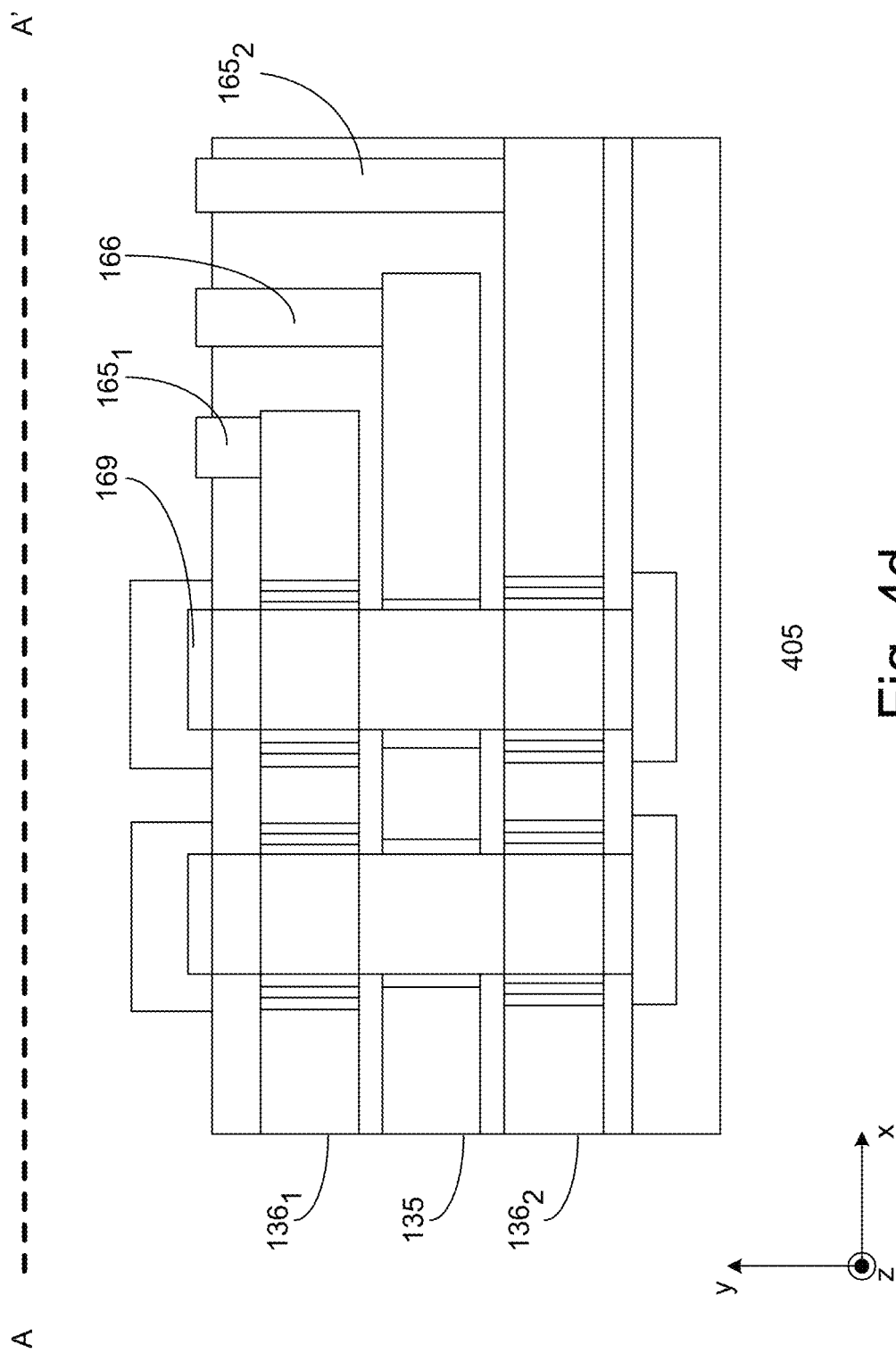

FIG. 4c shows a plan view of a portion of an array 405 and FIG. 4d shows a corresponding cross-sectional view along A-A'. As shown, the array includes memory cells 100, such as those described in FIG. 4a. In other embodiments, the array may include memory cells as described in FIG. 4b. Other types of memory cells may also be useful. Common elements may not be described or described in detail.

Bottom terminal lines 172 (not shown) are coupled to the bottom terminals of the transistors while top terminal lines 174 are coupled to the top terminals of the transistors. The bottom and top terminal lines are disposed along the same direction (z direction). Top and bottom terminal lines 174 and 172 serve as top and bottom BLs. First, second and intermediate gates $136_{1-2}$ and 135 surrounding first, second and intermediate channels on the bases are disposed along the direction orthogonal to the BLs. First and second gates serve as MGs and the intermediate gate serves as a SG. WLs are coupled to SGs and MLs are coupled to MGs. WLs and MLs are, for example, disposed in a metal level of the device above the memory cells and are coupled to the gates via contacts 166 and $165_{1-2}$ as shown in FIG. 4d. Bottom terminal lines are coupled to, for example, select metal lines (SMLs) in a metal level above the memory cells by via contacts (not shown). The BLs form columns of memory cells in the array while the gates form rows of memory cells. The via contacts may be disposed at about the periphery of the array. To provide access to upper metal levels, the bottom terminal lines extend the farthest distance while the first gate extends the least distance. Silicide contacts 169 may be provided on the bottom terminal line and gates to reduce resistance of the via contacts.

In one embodiment, the top and bottom BLs are disposed along the z direction while the gates are disposed along the x direction. The top BLs are coupled to the top terminals and the bottom BLs are coupled to the bottom terminals.

As illustrated, the width of the top and bottom terminal lines and the base is equal to 1F and the width of WLs and MLs are equal to 2F and a line pitch of 1F, where F is equal to the feature size. This produces a unit cell size of about 6F$^2$ and a bit density of about 3F$^2$. As such, the present memory cell has a small cell size. Other cell layouts or cell/bit sizes may also be useful.

FIGS. 5a-h show cross-sectional views of an embodiment of a process 500 for forming a memory cell. The memory cell, for example, is a part of a memory device. In other embodiment, the memory cell is a part of an IC device. The memory cell, for example, is similar to that described in FIG. 1c. Common elements may not be described or described in detail.

Referring to FIG. 5a, a substrate 101 is provided. The substrate can include a silicon substrate, such as lightly p-type doped substrate. Other types of substrates, including silicon germanium or silicon-on-insulator (SOI), may also be useful.

The substrate is prepared with an array region containing memory cells. In one embodiment, the memory cells include NVM cells. Other types of memory cells are also useful. The array region includes a doped well 160 with dopants of a second polarity type. The doped wells may be intermediately or heavily doped wells. For example, the dopant concentration of the doped well may be about $10^{15}$-$10^{17}$ cm$^{-3}$. Other dopant concentrations may also be useful. The doped well, for example, may be an array doped well in the array region. The second polarity type can be n-type or p-type, depending on the memory cell type. The second polarity type wells are used for first polarity type memory cells. For example, n-type wells are used for p-type memory cells while p-type wells are used for n-type memory cells. The doped well provides isolation between bottom BLs which are to be formed later.

Additionally, the substrate may include a logic region (not shown) for support circuitry. The substrate may also include regions for other types of circuitry, depending on the type of device or IC. The different device regions may be isolated from each other by isolation regions. For example, the device regions may be isolated from each other by shallow trench isolation (STI) regions. Other types of isolation regions may also be useful.

An implant is performed. In one embodiment, the implant forms doped bottom terminal lines 472 in the substrate. The bottom terminal lines may be disposed along the z direction. The bottom terminal lines are heavily doped with first polarity type dopants. For example, the dopant concentration of the bottom terminal lines may be about $10^{20}$ cm$^{-3}$. In one embodiment, the first polarity type is n-type. Providing p-type as the first polarity type may also be useful.

Forming of the bottom terminal lines may be facilitated by an implant mask. The bottom terminal lines may be about 80 nm thick and a width of about 1F, where F is the feature size. The bottom terminal lines, for example, should have sufficient thickness to reduce resistance. Providing bottom terminal lines having other dimensions may also be useful.

As shown in FIG. 5b, in one embodiment, a base stack is deposited over the substrate. The base stack includes various layers of a base. For example, the base stack includes semiconductor layers of the channels and the top and bottom terminals. Other configurations of the base stack may also be useful. The various layers of the base stack may be formed by epitaxial growth. Other techniques for forming the base stack layers may also be useful.

In one embodiment, the base stack includes a bottom terminal layer 522, a lower first channel layer 526$_2$, an intermediate channel layer 525, an upper second channel layer 526$_1$ and a top terminal layer 528. The top and bottom terminal layers may be heavily doped with first polarity type dopants. The dopant concentration, for example, may be about $10^{20}$ cm$^{-3}$. Other dopant concentrations may also be useful. In one embodiment, the top and bottom terminal layers may be doped by insitu doping. Other techniques for doping the top and bottom terminal layers may also be useful. In yet other embodiments, the top terminal layer may be doped in another part of the process flow. For example, the top terminal layer, at this stage of processing, may be intrinsic or undoped.

As shown, the intermediate channel layer serves as a SG channel layer, the first channel layer serves as a first MG channel layer and the second channel layer serves as a second MG channel layer. Other configurations of the base stack may also be useful.

The base includes different types of crystalline semiconductor materials, forming a heterogeneous base. In one embodiment, the first and second channel regions are formed of a crystalline semiconductor material different than the intermediate channel, forming heterogeneous channels. Preferably, the MG channels are the same but different than the intermediate channel. For example, the intermediate channel is formed of a first semiconductor material and the first and second channels are formed of a second crystalline semiconductor material. The terminal portions are formed of a terminal crystalline semiconductor material. The terminal crystalline material may be the same as the first crystalline semiconductor material. Providing terminal materials different from the first semiconductor material may also be useful.

In one embodiment, the first semiconductor material for the channel of the SG has a higher band gap than the second semiconductor material for the channel of the MGs. In one embodiment, the first semiconductor material is Si and the second semiconductor material is SiGe. In one embodiment, the terminal portions are formed of Si. Other configurations of the channels and terminals may also be useful.

Figure 5C:
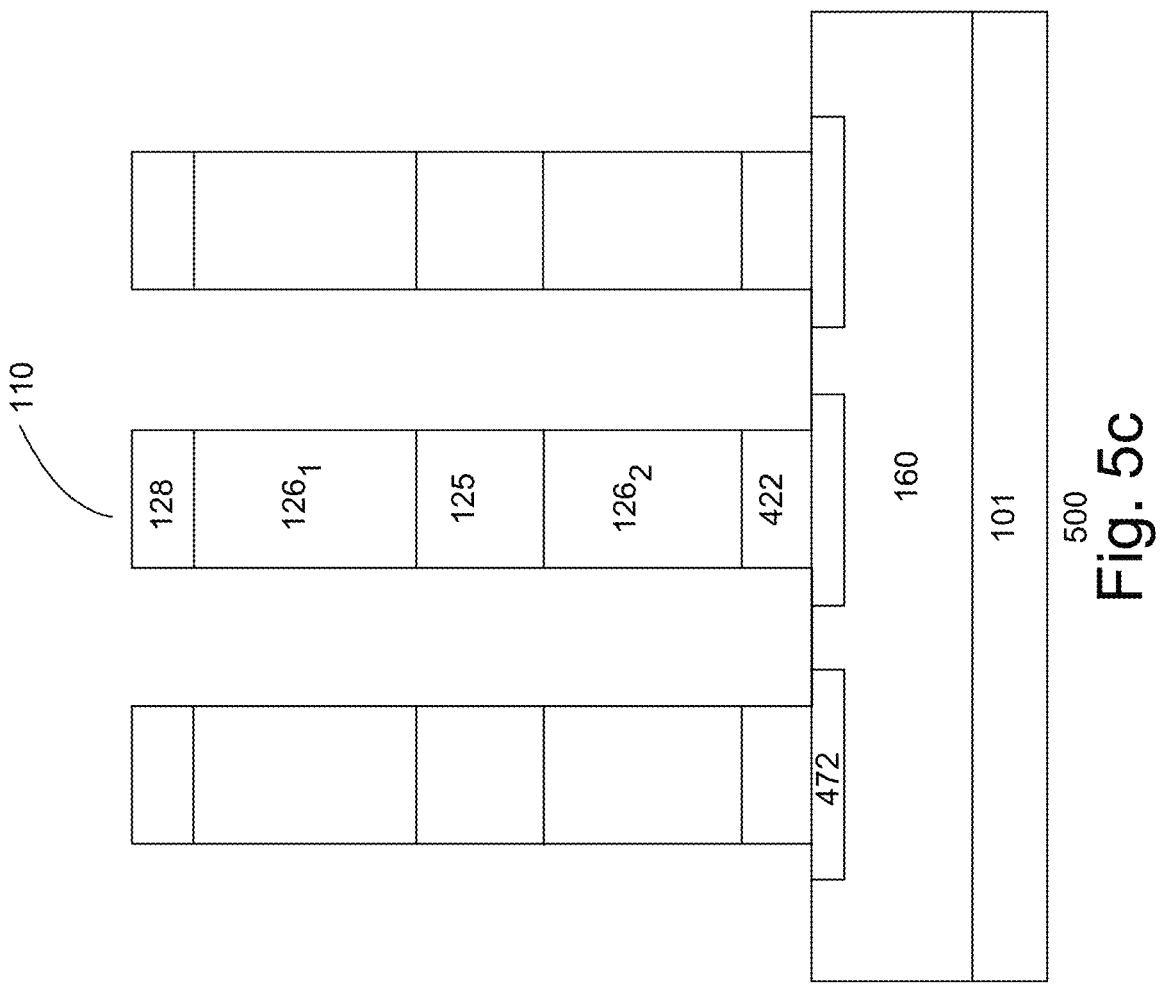

As illustrated in FIG. 5c, the base stack is patterned. In one embodiment, the base stack is patterned to form nanowire bases 110 for transistors. Patterning the base stack, for example, may employ a patterned hard mask (not shown) on the base stack. The patterned hard mask serves as an etch mask for an anisotropic etch, such as RIE. A hard mask layer including, for example, silicon oxide may be provided on the base stack. Other types of hard mask layers, such as silicon nitride, may also be useful. The hard mask layer is patterned using a soft mask, such as photoresist, which is exposed with the desired pattern through a photomask. To improve lithographic resolution, an anti-reflective coating (ARC) can be provided beneath the photoresist. The pattern of the photomask is transferred to the soft mask after development. The pattern of the soft mask is transferred to the hard mask by, for example, an anisotropic etch such as reactive ion etch (RIE). The patterned hard mask protects portions of the base stack corresponding to the bases. Exposed portions of the base stack are removed using, for example, by RIE, leaving bases on the substrate. In other embodiments, a soft mask is used to pattern the base stack.

A nanowire base includes channel regions 125 and 126$_{1-2}$ between top and bottom terminals 422 and 128. The cross-sectional shape of a base may be circular, having a dimension of about 1F. Other shapes or dimensions may also be useful.

Figure 5D:
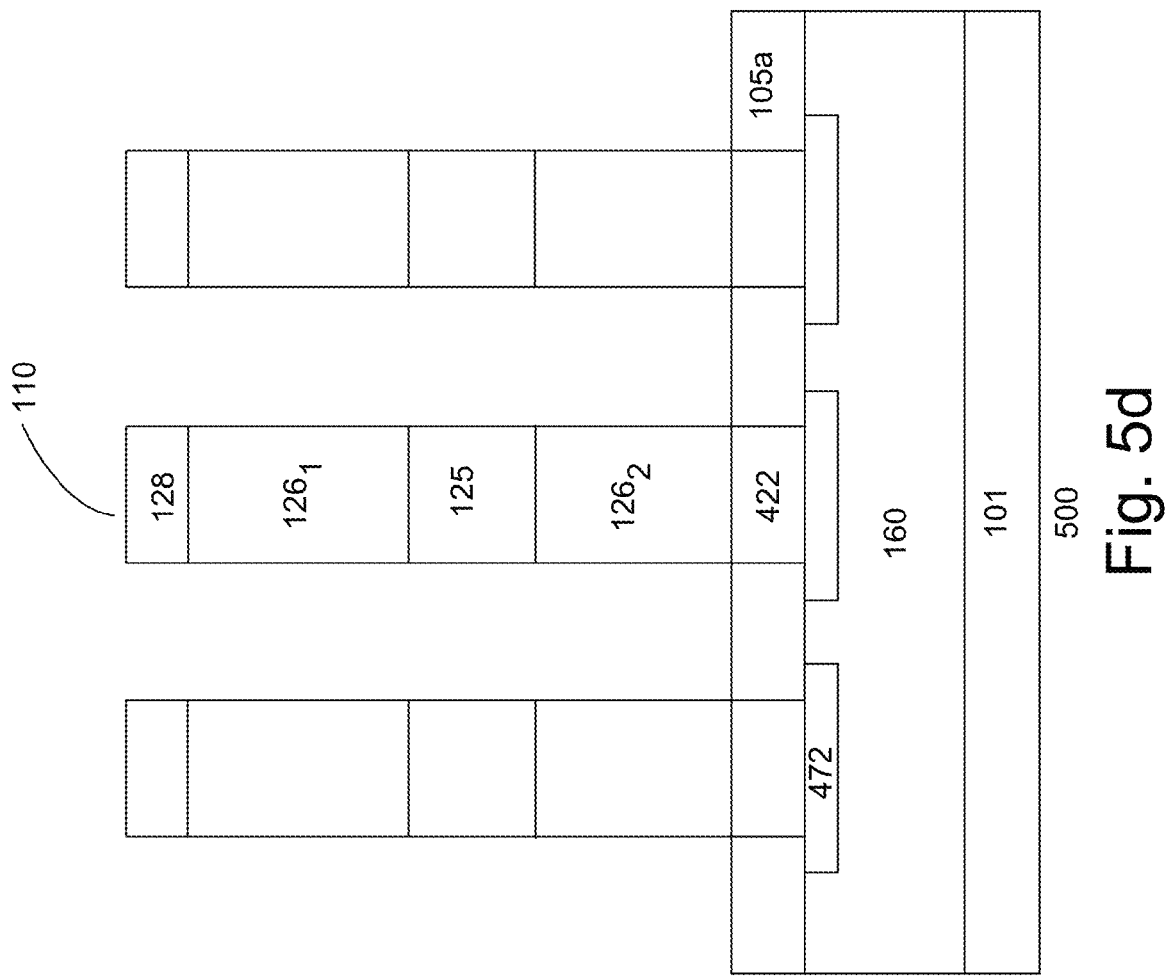

Referring to FIG. 5d, after the bases are formed, a dielectric layer is formed on the substrate. The dielectric layer, for example, may be silicon oxide. Other types of dielectric materials may also be useful. The dielectric layer fills the gaps between the bases. Excess dielectric material over the top of the top terminal may be removed by, for example, a planarizing process, such as chemical mechanical polishing (CMP). The planarizing process forms a planar surface between the dielectric layer and top of the bases. An etch back process is performed to recess the dielectric material to about the top of the bottom terminals, leaving dielectric layer 105a separating the bottom terminals. The etch back process, for example, may be dry or wet etch.

In one embodiment, lower second gates surrounding the lower second channel region are formed. The lower second gates serve as MG2. A second gate includes a second gate or MG2 electrode $126_2$ over a second gate or MG2 dielectric layer $134_2$. The second gate dielectric surrounds the second channel region of a base while the second gate electrode covers the second gate dielectric.

Figure 5E:
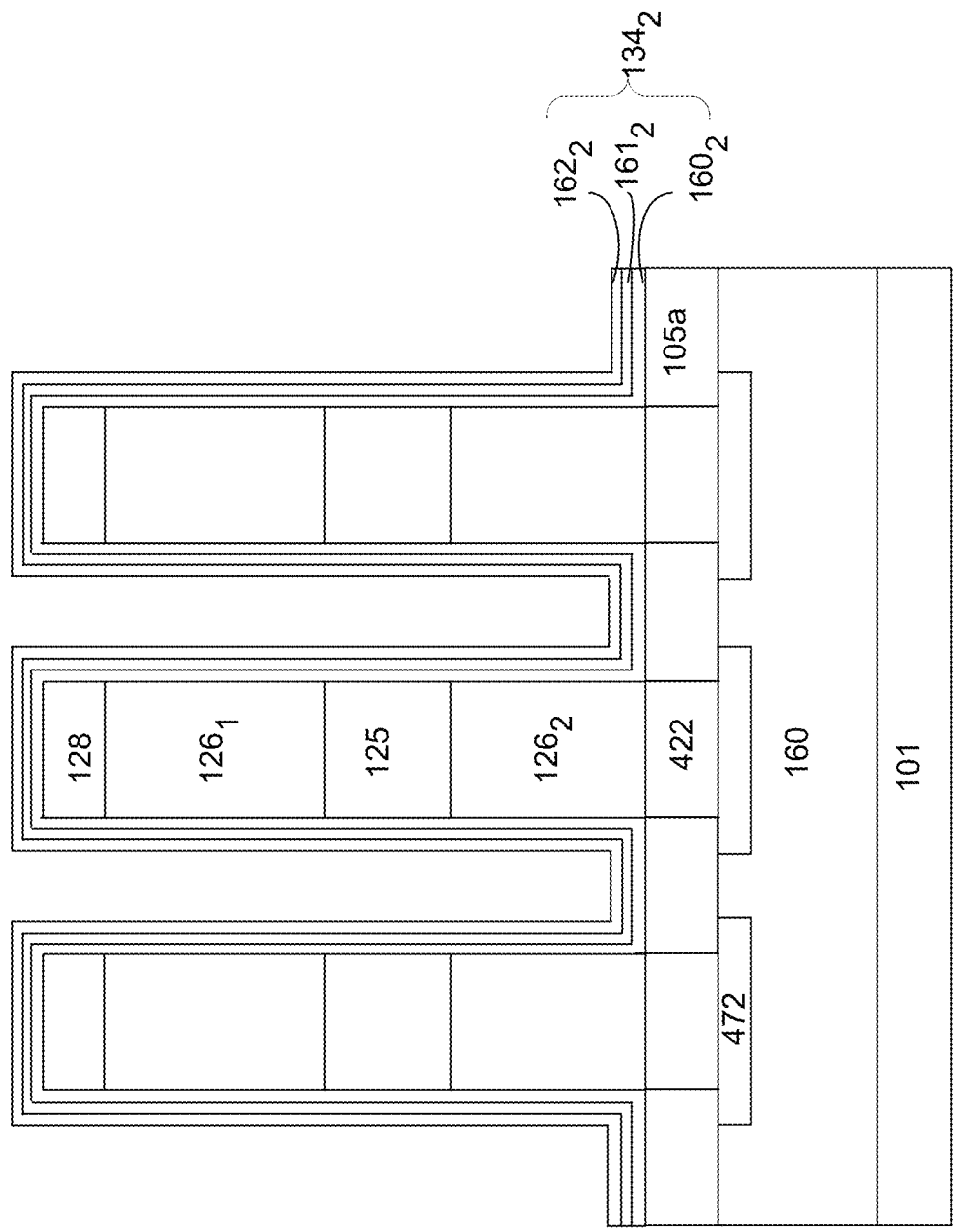

As shown in FIG. 5e, a second gate dielectric layer is formed over the substrate. In one embodiment, the second gate dielectric layer is a charge storage layer. For example, the second gate dielectric layer is a charge storage layer of the MG2. The second gate dielectric layer lines the base. In one embodiment, the second gate dielectric layer is a dielectric stack. The dielectric stack, for example, may include a first oxide layer $160_2$, a nitride layer $161_2$ and a second oxide layer $162_2$. The first oxide layer may serve as a tunneling layer, the nitride layer may serve as a charge storage layer and the second oxide layer may serve as a blocking layer. Various techniques may be employed to form the dielectric stack. For example, the first oxide layer may be formed by thermal oxidation while the nitride and second oxide layer may be formed by CVD. The thickness of the first oxide layer may be about 5 nm, the thickness of the nitride layer 161 may be about 7 nm, and the thickness of the second oxide layer may be about 7 nm. Other thicknesses and techniques or combinations of techniques may be employed to form the dielectric stack.

Figure 5F:
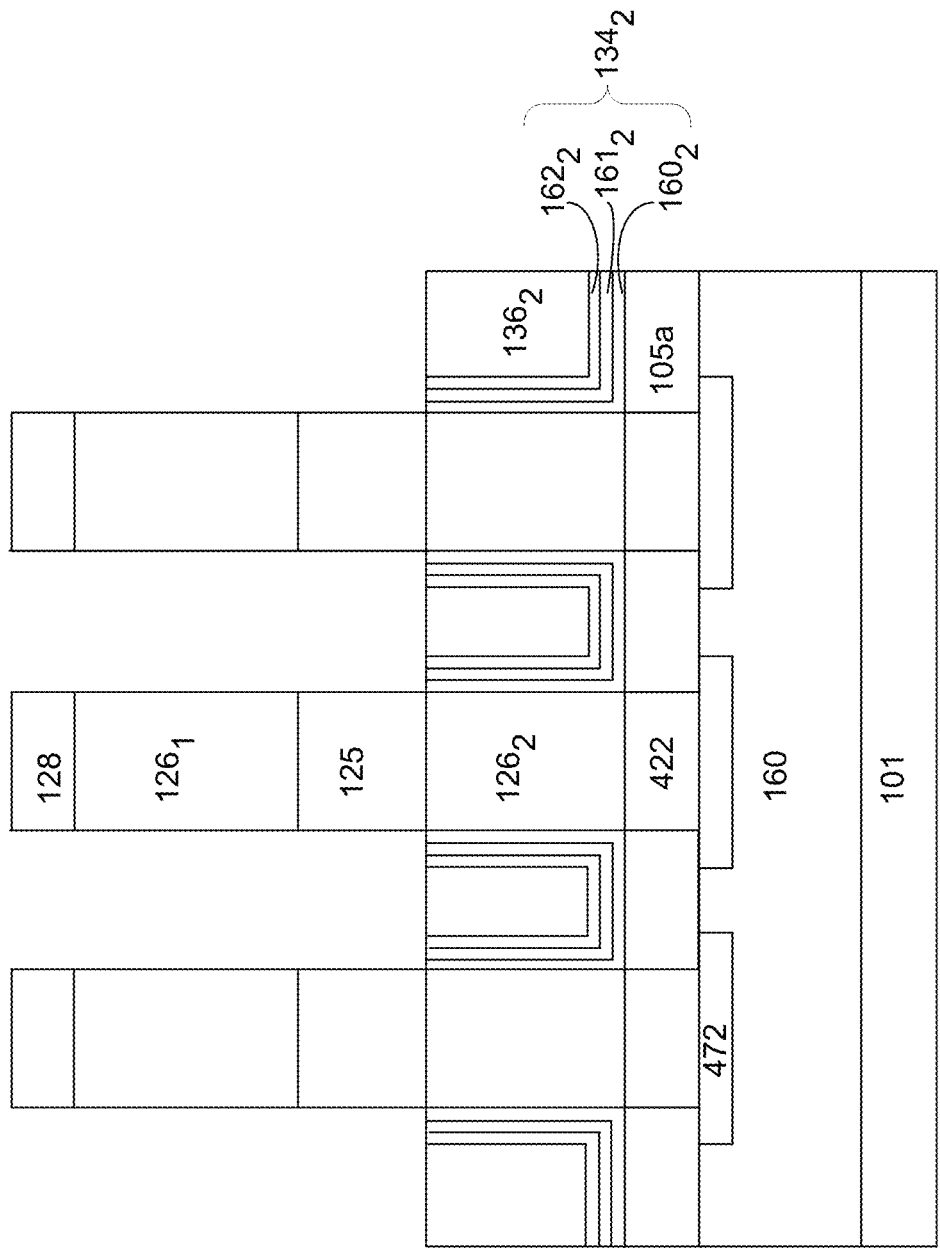

As shown in FIG. 5f, second gate electrodes $136_2$ are formed. The second gate electrodes, for example, may be polysilicon. The second gate electrodes may be a doped polysilicon. For example, the second gate electrode may be doped with n-type dopants for n-type transistor or doped with p-type dopants for p-type transistor. For example, a second gate electrode layer may be deposited on the substrate by CVD followed by CMP to form a planar top surface with the bases. The gate electrode layer is patterned by RIE with an etch mask to define the second gates. The gates, for example, are disposed along the x direction to form common gates for rows of bases. After removing the etch mask, the gates are recessed by an etch back process to define the second gate electrodes. The gates are recessed to about the top of the second channels. In one embodiment, the exposed portions of the second gate dielectric are removed to expose sides of the intermediate and first channels and top terminals. The exposed portions of the second gate dielectric may be removed by, for example, an isotropic etch, such as a wet etch. The removal process forms a planar surface between the second dielectric layers and top of the second gate electrodes. The second gates serve as MGs of memory cells.

Figure 5G:
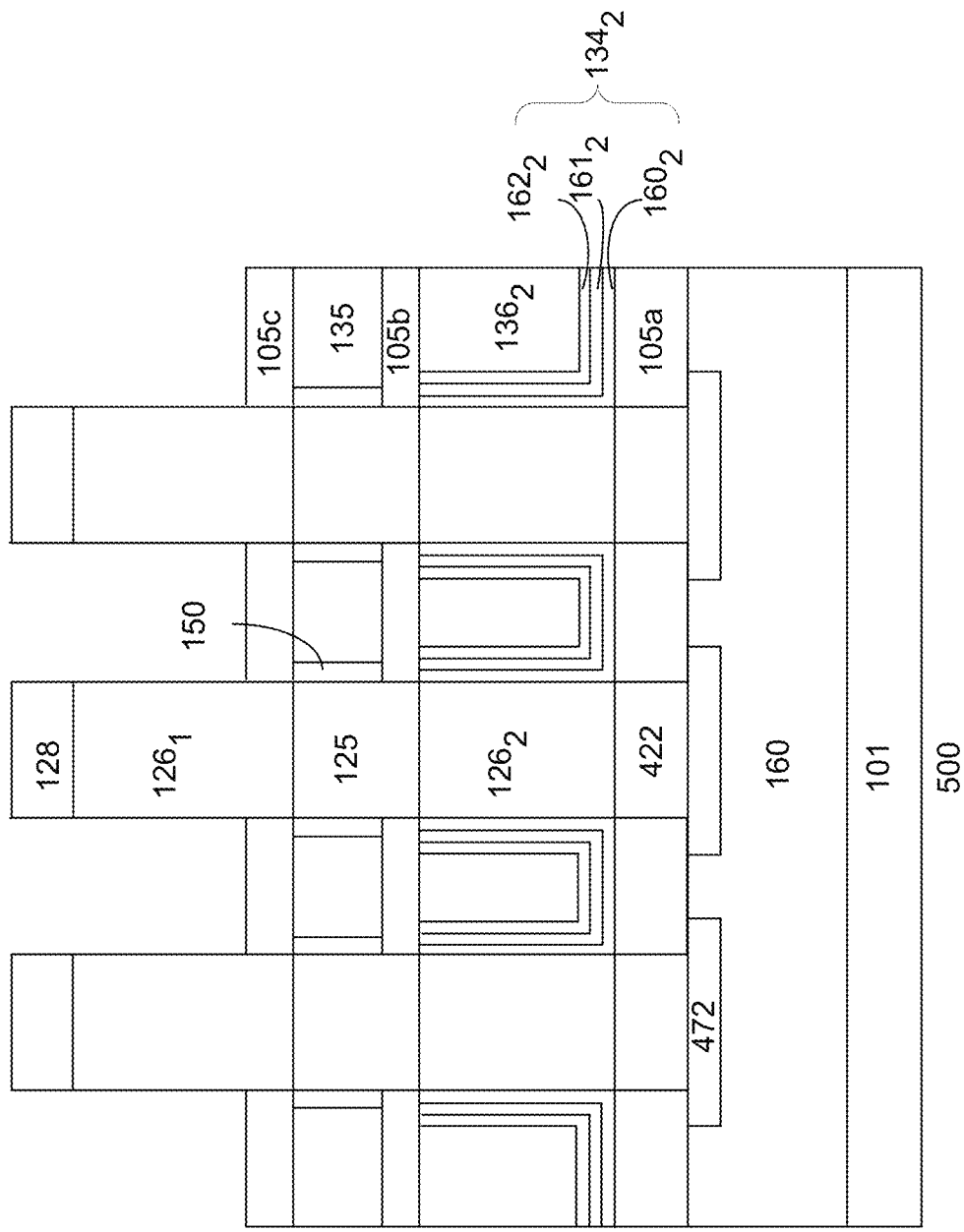

As illustrated in FIG. 5g, a dielectric layer is formed on the substrate. The dielectric layer, for example, may be silicon oxide. Other types of dielectric materials may also be useful. The dielectric layer fills the gaps between the bases as well as covering the top of the bases. Excess dielectric material over the top of the bases may be removed by, for example, a planarizing process, such as CMP. The planarizing process forms a planar surface between the dielectric layer and top of the bases. An etch back process is performed to recess the dielectric material to about 10 nm, leaving an inter-gate dielectric layer 105b over the second gates. The etch back process, for example, is dry or wet etch. Other types of etch back processes may also be useful.

In one embodiment, intermediate gates surrounding the intermediate channel regions of the bases are formed. In one embodiment, the intermediate gates serve as SGs. An intermediate gate or SG includes an intermediate gate or SG electrode 135 over an intermediate gate or SG dielectric 150. The intermediate gate dielectric surrounds the intermediate channel region of a base while the intermediate gate electrode covers the intermediate gate dielectric. The SG gate electrode, for example, is a common gate electrode of a row of bases along the first direction. For example, the SG gate electrode is a common SG electrode for a row of bases in the x direction. The SG gate dielectrics may be silicon oxide and the SG gate electrodes may be polysilicon. The SG gate electrodes may be a doped polysilicon. For example, the SG gate electrode may be doped with n-type dopants for n-type transistor or doped with p-type dopants for p-type transistor. Other types of gate dielectrics and/or gate electrodes may also be useful.

To form the SGs, SG gate dielectrics are formed. The SG gate dielectrics may be formed by, in one embodiment, thermal oxidation. For example, thermal oxide layer lines the crystalline bases and crystalline substrate. Other techniques for forming the SG gate dielectrics or other types of SG gate dielectrics may also be useful. An anisotropic etch, such as RIE, may be performed to remove horizontal portions of the gate dielectric from the top of the bases and substrate, leaving the SG gate dielectrics lining sides of the bases.

A SG electrode layer is deposited on the substrate after forming the SG dielectric. For example, a polysilicon layer is deposited by chemical vapor deposition (CVD). The gate electrode layer fills the gaps between and covers the bases. Other techniques for forming the intermediate gate electrode layer or other types of SG electrode layers may also be useful. Excess gate electrode material over the top of the bases may be removed by, for example, a planarizing process, such as CMP. The planarizing process forms a planar surface between the gate electrode layer and top of the bases.

The gate electrode layer is patterned to define gates. In one embodiment, the gate electrode layer is patterned by an anisotropic etch, such as RIE, using an etch mask, such as photoresist, to define the gates. Other techniques for patterning the gate electrode layer may also be useful. As discussed, the gates are disposed along the x direction, forming common gates for different rows of bases. The etch mask is removed after patterning the gate electrode materials.

An etch back process is performed to recess the gate electrode layer. The etch back process, for example, may be dry or wet etch. In one embodiment, the gate electrode layer is recessed to about the top of the intermediate channel, forming intermediate gates. This leaves the intermediate dielectric layer on the bases above the intermediate gates exposed. The exposed portions of the intermediate gate dielectric layer are removed by, for example, a wet etch. The wet etch, for example, is selective to gate electrode layer and bases. This completes the formation of the intermediate gates. The intermediate gates serve as SGs of memory cells.

In one embodiment, a dielectric layer is formed on the substrate. The dielectric layer, for example, may be silicon oxide. Other types of dielectric materials, such as SiCOH, may also be useful. The dielectric layer fills the gaps between the intermediate gates, bases as well as covering the top of the bases. Excess dielectric material over the top of the bases may be removed by, for example, a planarizing process, such as CMP. The planarizing process forms a planar surface between the dielectric layer and top of the bases. An etch back process is performed to recess the dielectric material to about the top of the isolation portion of the bases, leaving an inter-gate dielectric layer 105c over the intermediate gates. The thickness of the inter-gate dielectric 105c is about 10 nm to form a split gate structure between the intermediate and top gate electrode. The etch back process, for example, may be dry or wet etch. Other types of etch back processes may also be useful.

Figure 5H:
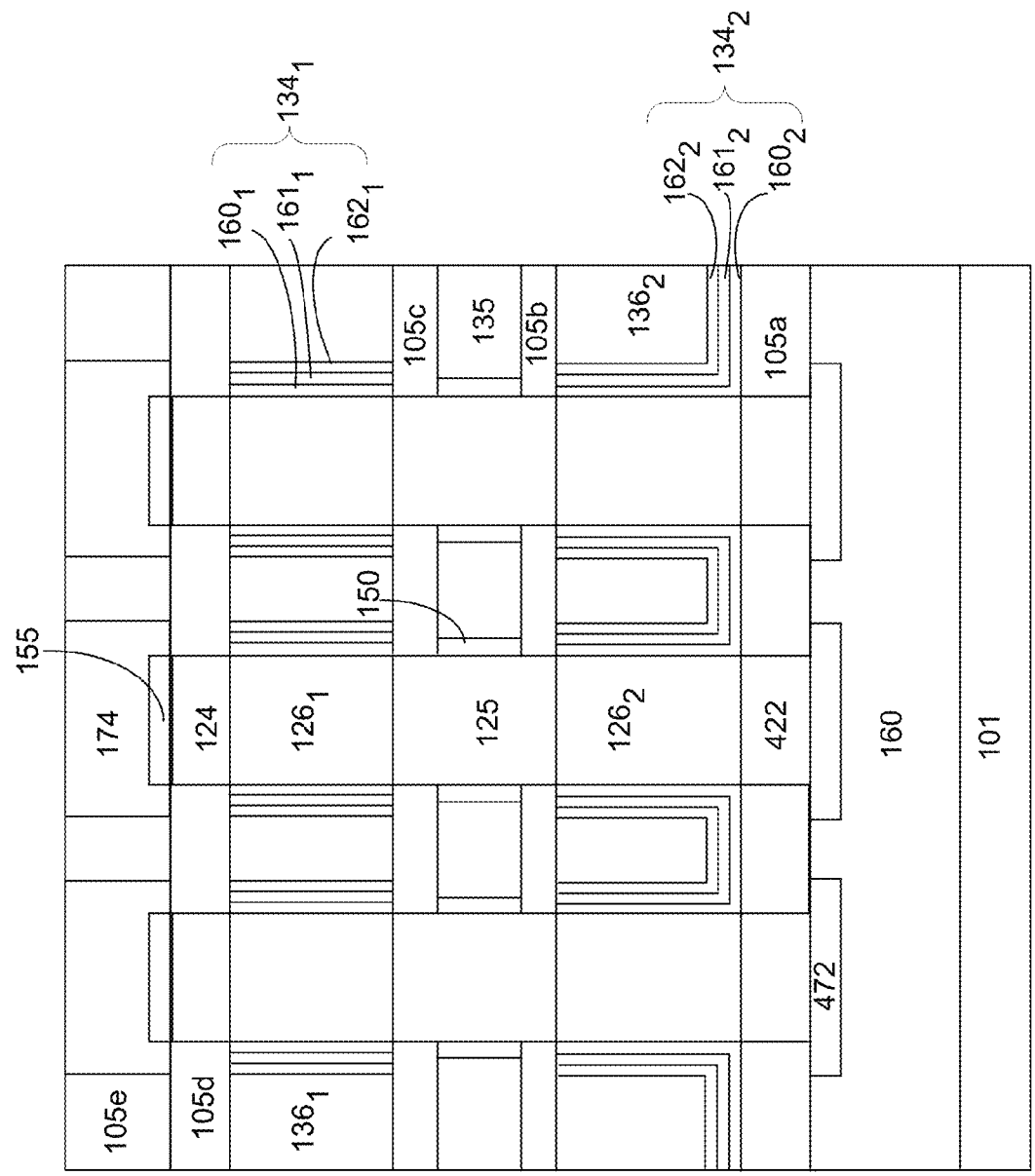

Referring to FIG. 5h, in one embodiment, upper first gates surrounding the upper first channel region are formed. The upper first gates serve as MG1. A first gate includes a first gate or MG1 electrode $126_1$ over a first gate or MG1 dielectric layer $134_1$. The first gate dielectric surrounds the first channel region of a base while the first gate electrode covers the first gate dielectric.

In one embodiment, a first gate dielectric layer is formed over the substrate. In one embodiment, the first gate dielectric layer is a charge storage layer. For example, the first gate dielectric layer is a charge storage layer of the MG1. The first gate dielectric layer lines the base. In one embodiment, the first gate dielectric layer is a dielectric stack. The dielectric stack, for example, may include a first oxide layer $160_1$, a nitride layer $161_1$ and a second oxide layer $162_1$. The first oxide layer may serve as a tunneling layer, the nitride layer may serve as a charge storage layer and the second oxide layer may serve as a blocking layer. Various techniques may be employed to form the dielectric stack. For example, the first oxide layer may be formed by thermal oxidation while the nitride and second oxide layer may be formed by CVD. The thickness of the first oxide layer may be about 5 nm, the thickness of the nitride layer may be about 7 nm, and the thickness of the second oxide layer may be about 7 nm. Other thicknesses and techniques or combinations of techniques may be employed to form the dielectric stack. An anisotropic etch, such as RIE, may be performed to remove horizontal portions of the gate dielectric from the top of the bases and substrate, leaving the first gate dielectrics lining sides of the bases.

In one embodiment, first gate electrodes $136_1$ are formed. The first gate electrodes, for example, may be polysilicon. The first gate electrodes may be a doped polysilicon. For example, the first gate electrode may be doped with n-type dopants for n-type transistor or doped with p-type dopants for p-type transistor. For example, a first gate electrode layer may be deposited on the substrate by CVD followed by CMP to form a planar top surface with the bases. The gate electrode layer is patterned by RIE with an etch mask to define the first gates. The gates, for example, are disposed along the x direction to form common gates for rows of bases. After removing the etch mask, the gates are recessed by an etch back process to define the first gate electrodes. The gates are recessed to about the top of the first channels. In one embodiment, the exposed portions of the first gate dielectric are removed to expose sides of the top terminals. The exposed portions of the first gate dielectric may be removed by, for example, an isotropic etch, such as a wet etch. The removal process forms a planar surface between the first dielectric layers and top of the first gate electrodes. The first gates serve as MG1s of memory cells.

In one embodiment, a dielectric layer is formed on the substrate. The dielectric layer, for example, may be silicon oxide. Other types of dielectric materials may also be useful. The dielectric layer fills the gaps between the bases as well as covering the top of the bases. Excess dielectric material over the top of the bases may be removed by, for example, a planarizing process, such as CMP. The planarizing process forms a planar surface between the dielectric layer and top of the bases, forming, for example, a top inter-terminal dielectric 105d isolating the top terminals.

In one embodiment, metal silicide contacts 155 are formed on the top terminals 124. For example, the nickel silicide contacts are formed on the top terminals. Other types of metal silicide contacts may also be useful. The thickness of the contacts may be about 30 nm. Providing other thicknesses may also be useful.

To form the salicide contacts, a metal layer is deposited on the surface of the substrate. The metal layer, for example, may be nickel or an alloy thereof. Other types of metallic layers, such as cobalt, or alloys thereof, including nickel, may also be used. The metal layer can be formed by Physical Vapor Deposition (PVD). Other types of metal elements and/or be formed by other types of processes can also be useful.

An anneal is performed, causing a reaction with the metal layer and top terminals, forming a silicided layer. The anneal, for example, is performed at a temperature of about 500 C. for about 10 sec. Unreacted metal in the silicidation process is removed by, for example, a wet removal process. For example, unreacted metallic material is removed selective to the salicide contacts. The annealing process may be a rapid thermal anneal (RTA). Other annealing parameters or techniques may also be useful to form the salicide contacts.

Top terminal lines 174 are formed over the base. The top terminal lines, in one embodiment, are disposed in the second direction. For example, the top terminal lines are disposed in the z direction. The first and second directions may be orthogonal. The top terminal lines, for example, is a common line connecting top terminals of bases in the second direction. For example, a top terminal line couples a column of bases. To form the top terminal lines, a damascene process may be employed. For example, an inter-line dielectric layer 105e is formed on the substrate over the bases and inter-terminal dielectric layer 105d. The inter-line dielectric layer, for example, may be silicon oxide. Other types of dielectric materials may also be useful. The inter-line dielectric layer is patterned to form trenches corresponding to the top terminal lines. The inter-line dielectric layer may be patterned using a patterned soft mask, such as photoresist. The trenches are filled with a conductive material, such as copper or copper alloy. Other types of conductive materials may also be useful. Excess conductive material is removed by, for example, CMP, forming top terminal lines. Other techniques for forming top terminal lines may also be useful. In one embodiment, the top terminal line is a first metal level (e.g., M1) of a device.

As described, the first and second gates are the MG1s and MG2s while the intermediate gates are the SGs. In such a case, the bottom terminals serve as sources of the transistors and the bottom terminal lines serve as second BLs. The top terminals serve as drains of the transistors and while the top terminal lines serve as first BLs.

MLs are coupled to MGs and WLs are coupled to SGs. The MLs and WLs are along a second or z direction. The gates along the first direction form rows of memory cells while BLs couple a plurality of bases in the second direction to form columns of memory cells, forming a memory array. Other configurations of BLs, MLs and WLs may also be useful.

FIGS. 6a-h show cross-sectional views of an embodiment of a process 600 for forming a memory cell. The memory cell, for example, is a part of a memory device. In other embodiment, the memory cell is a part of an IC device. The memory cell, for example, is similar to that described in FIG. 1c and FIGS. 4a-b. Common elements may not be described or described in detail.

Referring to FIG. 6a, a substrate 101 is provided. The substrate can include a silicon substrate, such as lightly p-type doped substrate. Other types of substrates, including silicon germanium or silicon-on-insulator (SOI), may also be useful.

The substrate is prepared with an array region containing memory cells. In one embodiment, the memory cells include NVM cells. Other types of memory cells are also useful. The substrate can be prepared with first isolation regions 105f, for example, to separate different memory cells. In one embodiment, the isolation regions comprise STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. The STI regions can be formed, for example, prior to or after the formation of the doped wells. Other processes or materials can also be used to form the STIs.

Additionally, the substrate may include a logic region (not shown) for support circuitry. The substrate may also include regions for other types of circuitry, depending on the type of device or IC. The different device regions may be isolated from each other by isolation regions. For example, the device regions may be isolated from each other by shallow trench isolation (STI) regions. Other types of isolation regions may also be useful.

An implant is performed. In one embodiment, the implant forms doped bottom terminal lines 472 in the substrate. The bottom terminal lines may be disposed along the z direction. The bottom terminal lines are heavily doped with first polarity type dopants. For example, the dopant concentration of the bottom terminal lines may be about $10^{20}$ $cm^{-3}$. In one embodiment, the first polarity type is n-type. Providing p-type as the first polarity type may also be useful. As shown, the isolation regions 105f are provided to isolate the bottom terminal lines.

Forming of the bottom terminal lines may be facilitated by an implant mask. The bottom terminal lines may be about 80 nm thick and a width of about 1F, where F is the feature size. Providing bottom terminal lines having other dimensions may also be useful.

Figure 6C:
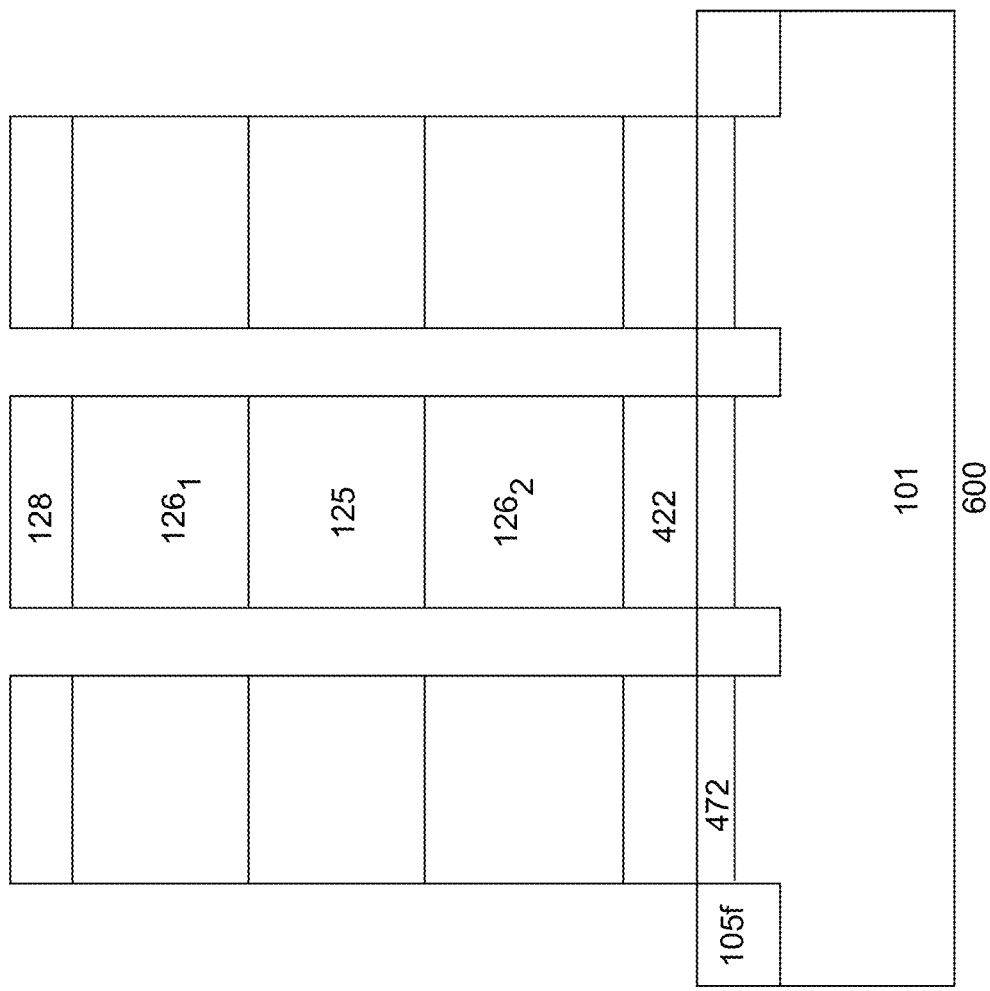

As shown in FIG. 6c, in one embodiment, base stacks are formed over the substrate. The base stack includes a bottom terminal layer 422, a lower first channel layer $126_2$, an intermediate channel layer 125, an upper second channel layer $126_1$ and a top terminal layer 128. For example, the base stack includes semiconductor layers of the channels and the top terminal. Other configurations of the base stack may also be useful. The various layers of the base stack may be formed by epitaxial growth. In one embodiment, the layers of the base stack are formed by selective epitaxial growth. Other techniques for forming the base stack layers may also be useful. The terminal layers may be heavily doped with first polarity type dopants. The dopant concentration, for example, may be about $10^{20}$ $cm^{-3}$. Other dopant concentrations may also be useful. In one embodiment, the terminal layers may be doped by insitu doping. Other techniques for doping the various terminal layers may also be useful. In yet other embodiments, the top terminal layers may be doped in another part of the process flow. For example, the top terminal layer, at this stage of processing, may be intrinsic or undoped.

As shown, the intermediate channel layer serves as a SG channel layer, the first channel layer serves as a first MG channel layer and the second channel layer serves as a second MG channel layer. Other configurations of the base stack may also be useful.

The base includes different types of crystalline semiconductor materials, forming a heterogeneous base. In one embodiment, the first and second channel regions are formed of a crystalline semiconductor material different than the intermediate channel, forming heterogeneous channels. Preferably, the MG channels are the same but different than the intermediate channel. For example, the intermediate channel is formed of a first semiconductor material and the first and second channels are formed of a second crystalline semiconductor material. The terminal portions are formed of a terminal crystalline semiconductor material. The terminal crystalline material may be the same as the first crystalline semiconductor material. Providing terminal materials different from the first semiconductor material may also be useful.

In one embodiment, the first semiconductor material for the channel of the SG has a higher band gap than the second semiconductor material for the channel of the MGs. In one embodiment, the first semiconductor material is Si and the second semiconductor material is SiGe. In one embodiment, the terminal portions are formed of Si. Other configurations of the channels and terminals may also be useful.

Figure 6D:
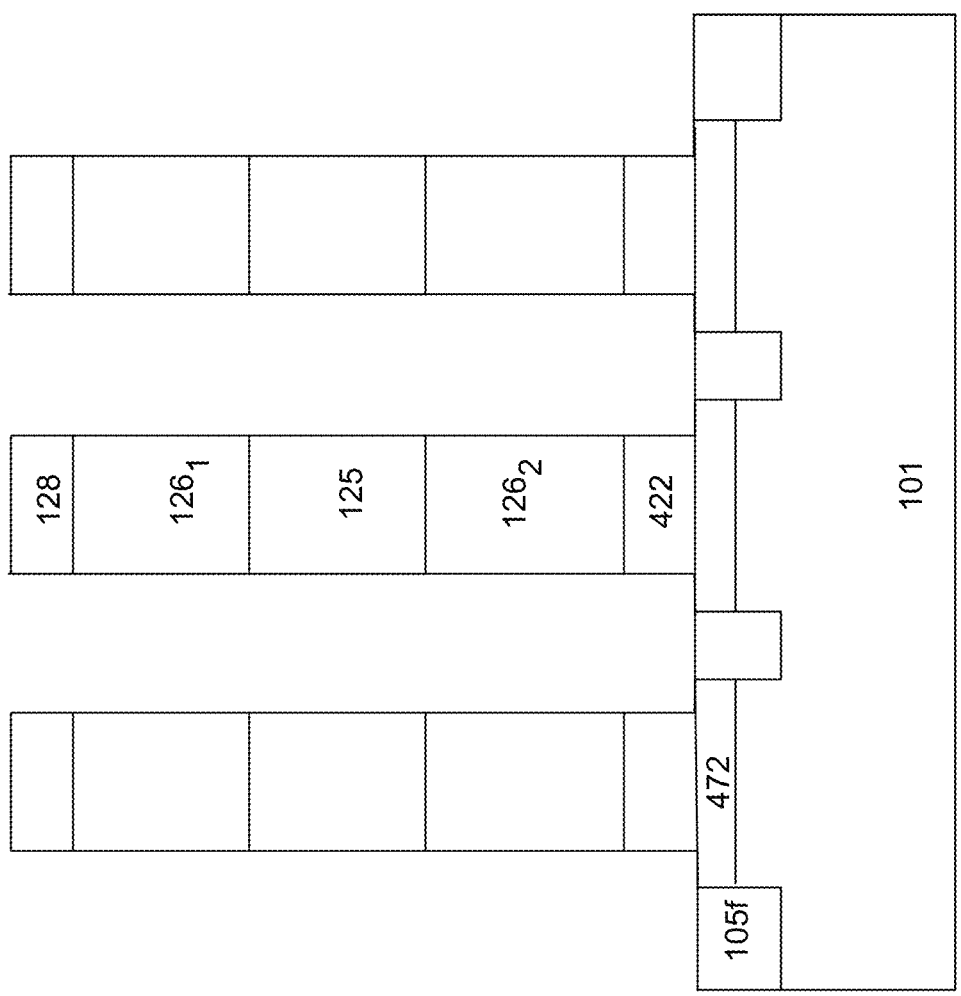

Referring to FIG. 6d, the base stack is patterned. In one embodiment, the base stack is patterned to form nanowire bases 110 for transistors. Patterning the base stack, for example, may employ a patterned hard mask (not shown) on the base stack. The patterned hard mask serves as an etch mask for an anisotropic etch, such as RIE. A hard mask layer including, for example, silicon oxide may be provided on the base stack. Other types of hard mask layers, such as silicon nitride, may also be useful. The hard mask layer is patterned using a soft mask, such as photoresist, which is exposed with the desired pattern through a photomask. To improve lithographic resolution, an anti-reflective coating (ARC) can be provided beneath the photoresist. The pattern of the photomask is transferred to the soft mask after development. The pattern of the soft mask is transferred to the hard mask by, for example, an anisotropic etch such as reactive ion etch (RIE). The patterned hard mask protects portions of the base stack corresponding to the bases. Exposed portions of the base stack are removed using, for example, by RIE, leaving bases on the substrate. In other embodiments, a soft mask is used to pattern the base stack.

A nanowire base includes channel regions 125 and $126_{1-2}$ between top and bottom terminals 422 and 128. The cross-sectional shape of a base may be circular, having a dimension of about 1F. Other shapes or dimensions may also be useful. In the case where the substrate includes the bottom terminal layer, the etch to form the bases also etches the substrate to form the bottom terminals.

Referring to FIG. 6e, after the bases are formed, a dielectric layer is formed on the substrate. The dielectric layer, for example, may be silicon oxide. Other types of dielectric materials may also be useful. The dielectric layer fills the gaps between the bases. Excess dielectric material over the top of the top terminal may be removed by, for example, a planarizing process, such as chemical mechanical polishing (CMP). The planarizing process forms a planar surface between the dielectric layer and top of the bases. An etch back process is performed to recess the dielectric material to about the top of the bottom terminals, leaving dielectric layer 105a separating the bottom terminals. The etch back process, for example, may be dry or wet etch.

In one embodiment, lower second gates surrounding the lower second channel region are formed. The lower second gates serve as MG2. A second gate includes a second gate or MG2 electrode $126_2$ over a second gate or MG2 dielectric layer $134_2$. The second gate dielectric surrounds the second channel region of a base while the second gate electrode covers the second gate dielectric.

Figure 6F:
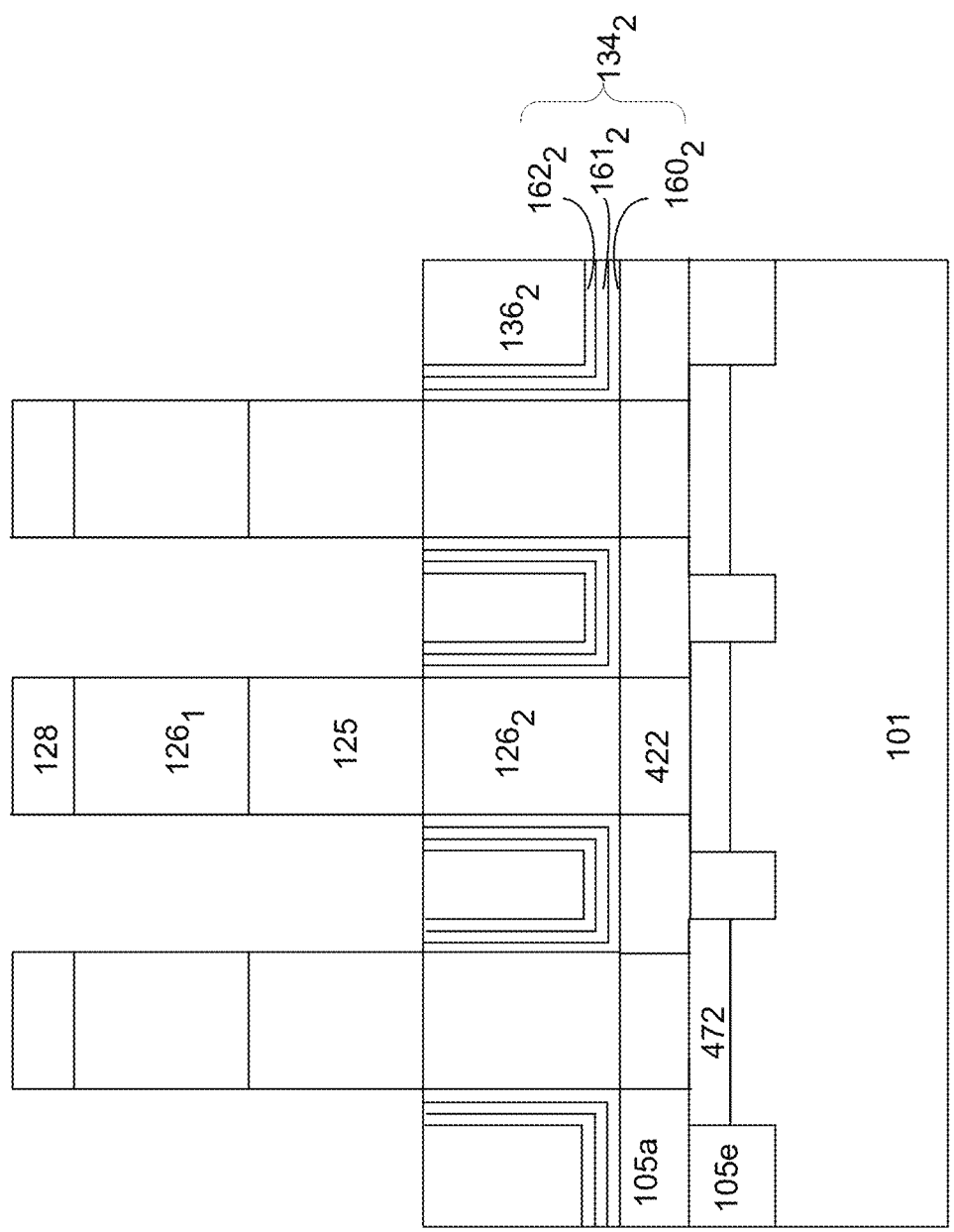

As shown in FIG. 6f, a second gate dielectric layer is formed over the substrate. In one embodiment, the second gate dielectric layer is a charge storage layer. For example, the second gate dielectric layer is a charge storage layer of the MG2. The second gate dielectric layer lines the base. In one embodiment, the second gate dielectric layer is a dielectric stack. The dielectric stack, for example, may include a first oxide layer $160_2$, a nitride layer $161_2$ and a second oxide layer $162_2$. The first oxide layer may serve as a tunneling layer, the nitride layer may serve as a charge storage layer and the second oxide layer may serve as a blocking layer. Various techniques may be employed to form the dielectric stack. For example, the first oxide layer may be formed by thermal oxidation while the nitride and second oxide layer may be formed by CVD. The thickness of the first oxide layer may be about 5 nm, the thickness of the nitride layer 161 may be about 7 nm, and the thickness of the second oxide layer may be about 7 nm. Other thicknesses and techniques or combinations of techniques may be employed to form the dielectric stack.

In one embodiment, second gate electrodes $136_2$ are formed. The second gate electrodes, for example, may be polysilicon. The second gate electrodes may be a doped polysilicon. For example, the second gate electrode may be doped with n-type dopants for n-type transistor or doped with p-type dopants for p-type transistor. For example, a second gate electrode layer may be deposited on the substrate by CVD followed by CMP to form a planar top surface with the bases. The gate electrode layer is patterned by RIE with an etch mask to define the second gates. The gates, for example, are disposed along the x direction to form common gates for rows of bases. After removing the etch mask, the gates are recessed by an etch back process to define the second gate electrodes. The gates are recessed to about the top of the second channels. In one embodiment, the exposed portions of the second gate dielectric are removed to expose sides of the intermediate and first channels and top terminals. The exposed portions of the second gate dielectric may be removed by, for example, an isotropic etch, such as a wet etch. The removal process forms a planar surface between the second dielectric layers and top of the second gate electrodes. The second gates serve as MGs of memory cells.

Figure 6G:
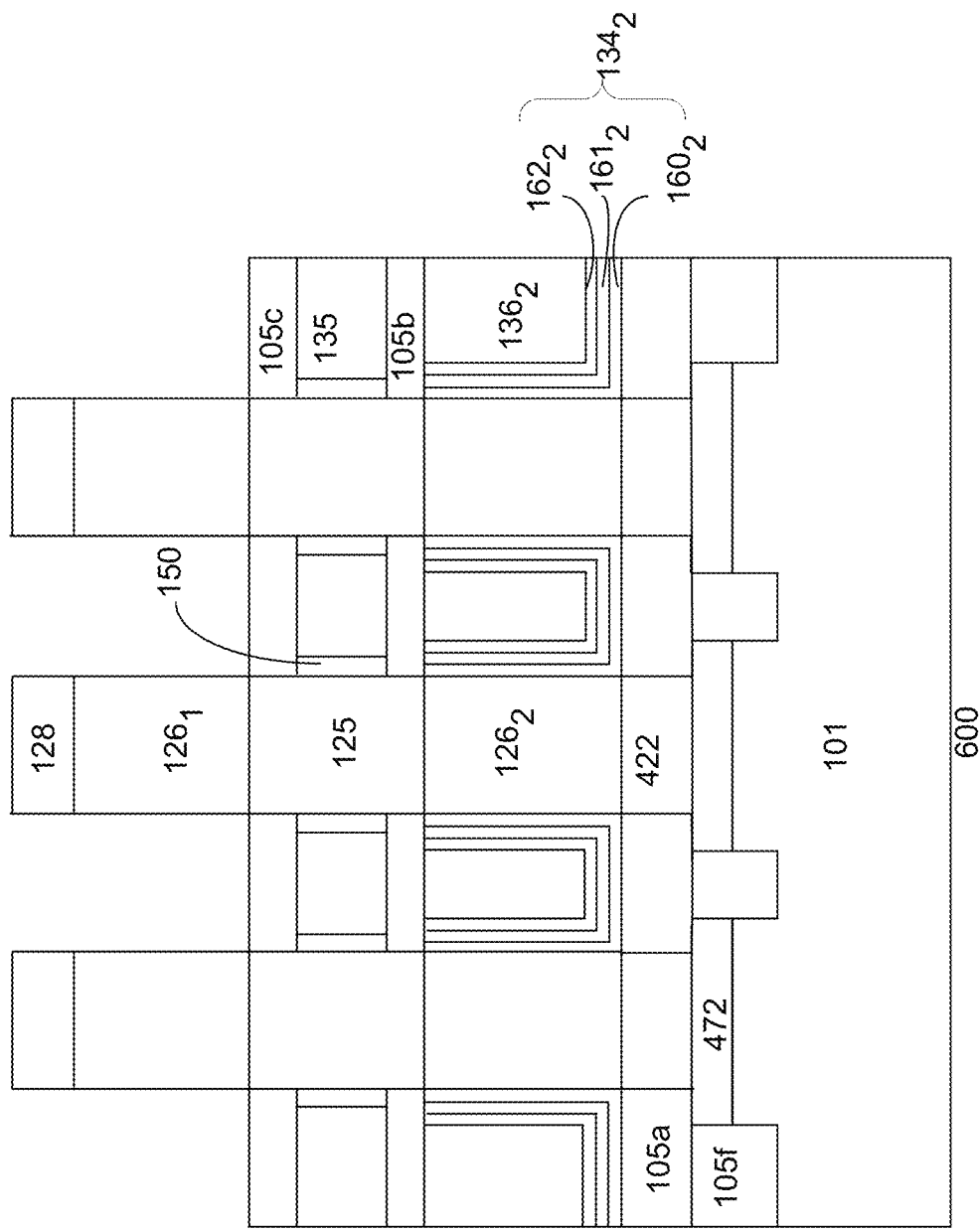

As illustrated in FIG. 6g, a dielectric layer is formed on the substrate. The dielectric layer, for example, may be silicon oxide. Other types of dielectric materials may also be useful. The dielectric layer fills the gaps between the bases as well as covering the top of the bases. Excess dielectric material over the top of the bases may be removed by, for example, a planarizing process, such as CMP. The planarizing process forms a planar surface between the dielectric layer and top of the bases. An etch back process is performed to recess the dielectric material to about 10 nm, leaving an inter-gate dielectric layer 105b over the second gates to form a split gate structure between the bottom and intermediate gate electrode. The etch back process, for example, is dry or wet etch. Other types of etch back processes may also be useful.

In one embodiment, intermediate gates surrounding the intermediate channel regions of the bases are formed. In one embodiment, the intermediate gates serve as SGs. An intermediate gate or SG includes an intermediate gate or SG electrode 135 over an intermediate gate or SG dielectric 150. The intermediate gate dielectric surrounds the intermediate channel region of a base while the intermediate gate electrode covers the intermediate gate dielectric. The SG gate electrode, for example, is a common gate electrode of a row of bases along the first direction. For example, the SG gate electrode is a common SG electrode for a row of bases in the x direction. The SG gate dielectrics may be silicon oxide and the SG gate electrodes may be polysilicon. The SG gate electrodes may be a doped polysilicon. For example, the SG gate electrode may be doped with n-type dopants for n-type transistor or doped with p-type dopants for p-type transistor. Other types of gate dielectrics and/or gate electrodes may also be useful.

To form the SGs, SG gate dielectrics are formed. The SG gate dielectrics may be formed by, in one embodiment, thermal oxidation. For example, thermal oxide layer lines the crystalline bases and crystalline substrate. Other techniques for forming the SG gate dielectrics or other types of SG gate dielectrics may also be useful. An anisotropic etch, such as RIE, may be performed to remove horizontal portions of the gate dielectric from the top of the bases and substrate, leaving the SG gate dielectrics lining sides of the bases.

A SG electrode layer is deposited on the substrate after forming the SG dielectric. For example, a polysilicon layer is deposited by chemical vapor deposition (CVD). The gate electrode layer fills the gaps between and covers the bases. Other techniques for forming the first gate electrode layer or other types of SG electrode layers may also be useful. Excess gate electrode material over the top of the bases may be removed by, for example, a planarizing process, such as CMP. The planarizing process forms a planar surface between the gate electrode layer and top of the bases.

The gate electrode layer is patterned to define gates. In one embodiment, the gate electrode layer is patterned by an anisotropic etch, such as RIE, using an etch mask, such as photoresist, to define the gates. Other techniques for patterning the gate electrode layer may also be useful. As discussed, the gates are disposed along the x direction, forming common gates for different rows of bases. The etch mask is removed after patterning the gate electrode materials.

An etch back process is performed to recess the gate electrode layer. The etch back process, for example, may be dry or wet etch. In one embodiment, the gate electrode layer is recessed to about the top of the intermediate channel, forming intermediate gates. This leaves the intermediate dielectric layer on the bases above the intermediate gates exposed. The exposed portions of the intermediate gate dielectric layer are removed by, for example, a wet etch. The wet etch, for example, is selective to gate electrode layer and bases. This completes the formation of the intermediate gates. The intermediate gates serve as SGs of memory cells.

In one embodiment, a dielectric layer is formed on the substrate. The dielectric layer, for example, may be silicon oxide. Other types of dielectric materials may also be useful. The dielectric layer fills the gaps between the intermediate gates, bases as well as covering the top of the bases. Excess dielectric material over the top of the bases may be removed by, for example, a planarizing process, such as CMP. The planarizing process forms a planar surface between the dielectric layer and top of the bases. An etch back process is performed to recess the dielectric material to about the top of the isolation portion of the bases, leaving an inter-gate dielectric layer 105c over the intermediate gates. The thickness of the inter-gate dielectric 105c is about 10 nm to form a split gate structure between the intermediate and top gate electrode. The etch back process, for example, may be dry or wet etch. Other types of etch back processes may also be useful.

Figure 6H:
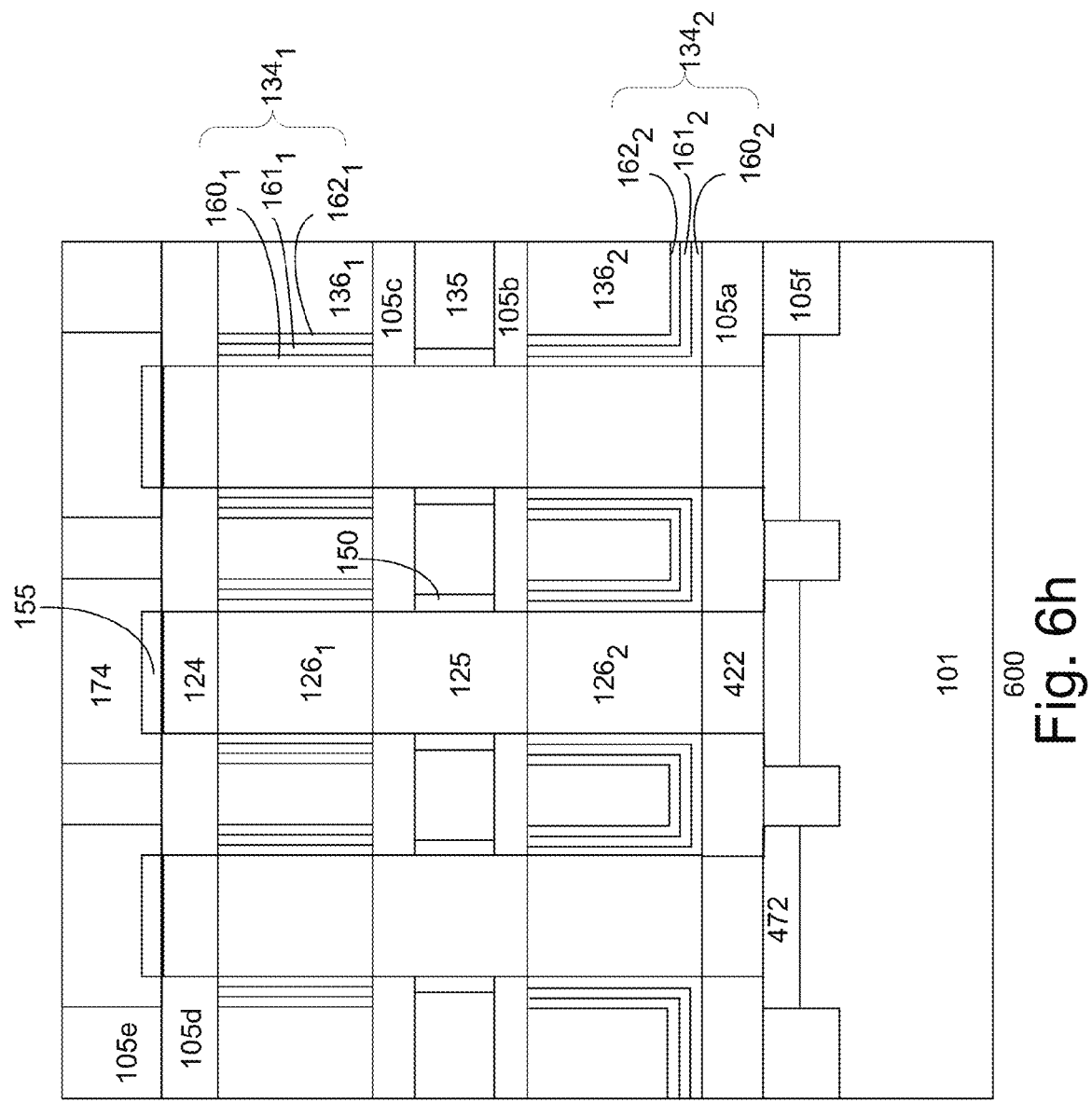

Referring to FIG. 6h, in one embodiment, upper first gates surrounding the upper first channel region are formed. The upper first gates serve as MG1. A first gate includes a first gate or MG1 electrode $126_1$ over a first gate or MG1 dielectric layer $134_1$. The first gate dielectric surrounds the first channel region of a base while the first gate electrode covers the first gate dielectric.

In one embodiment, a first gate dielectric layer is formed over the substrate. In one embodiment, the first gate dielectric layer is a charge storage layer. For example, the first gate dielectric layer is a charge storage layer of the MG1. The first gate dielectric layer lines the base. In one embodiment, the first gate dielectric layer is a dielectric stack. The dielectric stack, for example, may include a first oxide layer $160_1$, a nitride layer $161_1$ and a second oxide layer $162_1$. The first oxide layer may serve as a tunneling layer, the nitride layer may serve as a charge storage layer and the second oxide layer may serve as a blocking layer. Various techniques may be employed to form the dielectric stack. For example, the first oxide layer may be formed by thermal oxidation while the nitride and second oxide layer may be formed by CVD. The thickness of the first oxide layer may be about 5 nm, the thickness of the nitride layer may be about 7 nm, and the thickness of the second oxide layer may be about 7 nm. Other thicknesses and techniques or combinations of techniques may be employed to form the dielectric stack. An anisotropic etch, such as RIE, may be performed to remove horizontal portions of the gate dielectric from the top of the bases and substrate, leaving the first gate dielectrics lining sides of the bases.

In one embodiment, first gate electrodes $136_1$ are formed. The first gate electrodes, for example, may be polysilicon. The first gate electrodes may be a doped polysilicon. For example, the first gate electrode may be doped with n-type dopants for n-type transistor or doped with p-type dopants for p-type transistor. For example, a first gate electrode layer may be deposited on the substrate by CVD followed by CMP to form a planar top surface with the bases. The gate electrode layer is patterned by RIE with an etch mask to define the first gates. The gates, for example, are disposed along the x direction to form common gates for rows of bases. After removing the etch mask, the gates are recessed by an etch back process to define the first gate electrodes. The gates are recessed to about the top of the first channels. In one embodiment, the exposed portions of the first gate dielectric are removed to expose sides of the top terminals. The exposed portions of the first gate dielectric may be removed by, for example, an isotropic etch, such as a wet etch. The removal process forms a planar surface between the first dielectric layers and top of the first gate electrodes. The first gates serve as MG1s of memory cells.

In one embodiment, a dielectric layer is formed on the substrate. The dielectric layer, for example, may be silicon oxide. Other types of dielectric materials, may also be useful. The dielectric layer fills the gaps between the bases as well as covering the top of the bases. Excess dielectric material over the top of the bases may be removed by, for example, a planarizing process, such as CMP. The planarizing process forms a planar surface between the dielectric layer and top of the bases, forming, for example, a top inter-terminal dielectric 105d isolating the top terminals.

In one embodiment, metal silicide contacts 155 are formed on the top terminals 124. For example, the nickel silicide contacts are formed on the top terminals. Other types of metal silicide contacts may also be useful. The thickness of the contacts may be about 30 nm. Providing other thicknesses may also be useful.

To form the salicide contacts, a metal layer is deposited on the surface of the substrate. The metal layer, for example, may be nickel or an alloy thereof. Other types of metallic layers, such as cobalt, or alloys thereof, including nickel, may also be used. The metal layer can be formed by Physical Vapor Deposition (PVD). Other types of metal elements and/or be formed by other types of processes can also be useful.

An anneal is performed, causing a reaction with the metal layer and top terminals, forming a silicided layer. The anneal, for example, is performed at a temperature of about 500 C. for about 10 sec. Unreacted metal in the silicidation process is removed by, for example, a wet removal process. For example, unreacted metallic material is removed selective to the salicide contacts. The annealing process may be a rapid thermal anneal (RTA). Other annealing parameters or techniques may also be useful to form the salicide contacts.

Top terminal lines 174 are formed over the base. The top terminal lines, in one embodiment, are disposed in the second direction. For example, the top terminal lines are disposed in the z direction. The first and second directions may be orthogonal. The top terminal lines, for example, is a common line connecting top terminals of bases in the second direction. For example, a top terminal line couples a column of bases. To form the top terminal lines, a damascene process may be employed. For example, an inter-line dielectric layer 105e is formed on the substrate over the bases and inter-terminal dielectric layer 105d. The inter-line dielectric layer, for example, may be silicon oxide. Other types of dielectric materials may also be useful. The inter-line dielectric layer is patterned to form trenches corresponding to the top terminal lines. The inter-line dielectric layer may be patterned using a patterned soft mask, such as photoresist. The trenches are filled with a conductive material, such as copper or copper alloy. Other types of conductive materials may also be useful. Excess conductive material is removed by, for example, CMP, forming top terminal lines. Other techniques for forming top terminal lines may also be useful. In one embodiment, the top terminal line is a first metal level (e.g., M1) of a device.

As described, the first and second gates are the MG1s and MG2s while the intermediate gates are the SGs. In such a case, the bottom terminals serve as sources of the transistors and the bottom terminal lines serve as second BLs. The top terminals serve as drains of the transistors and while the top terminal lines serve as first BLs.

MLs are coupled to MGs and WLs are coupled to SGs. The MLs and WLs are along a second or z direction. The gates along the first direction form rows of memory cells while BLs couple a plurality of bases in the second direction to form columns of memory cells, forming a memory array. Other configurations of BLs, MLs and WLs may also be useful.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory cell comprising:
   a vertical base disposed on a substrate, the vertical base includes first and second channels between top and bottom terminals;

a first gate surrounding the first channel; and
a second gate surrounding the second channel, wherein the first and second gates form a gate-all-around transistor of the memory cell.

2. The memory cell of claim 1 wherein:
a bottom terminal line is disposed in the substrate coupled with the base; and
a top terminal line is disposed over the base coupled to the top terminal.

3. The memory cell of claim 1 wherein:
the bottom terminal is part of the substrate; and
the base includes the first and second channels and the top terminal.

4. The memory cell of claim 1 wherein
the first gate serves as a select gate;
the second gate serves as a memory gate.

5. The memory cell of claim 4 wherein the select gate is closer to the substrate.

6. The memory cell of claim 1 wherein the first channel and the second channel comprise different crystalline semiconductor materials.

7. The memory cell of claim 6 wherein the first semiconductor material has a higher band gap than the second semiconductor material.

8. The memory cell of claim 6 wherein:
the first semiconductor material comprises silicon; and
the second semiconductor material comprises silicon germanium.

9. The memory cell of claim 7 wherein the second channel comprises a heterogeneous channel having the second semiconductor material adjacent to the first channel and a third semiconductor material.

10. The memory cell of claim 9 wherein:
the first and third semiconductor materials comprise silicon; and
the second semiconductor material comprises silicon germanium.

11. The memory cell of claim 1 comprises:
an intermediate channel between first and second channels with an intermediate gate surrounding the intermediate channel, the intermediate gate serves as a select gate; and
the first and second gates serve as first and second memory gates for a dual bit memory cell.

12. The memory cell of claim 11 wherein:
the first channel comprises a first semiconductor material;
the intermediate channel comprises an intermediate semiconductor material; and
the second channel comprises a second semiconductor material, wherein the intermediate semiconductor material is different form the first and second semiconductor materials.

13. The memory cell of claim 12 wherein the intermediate semiconductor material has a higher band gap than the second semiconductor material.

14. The memory cell of claim 13 wherein:
the first and second semiconductor materials are the same and comprise silicon germanium; and
the intermediate semiconductor material comprises silicon.

15. The memory cell of claim 13 wherein:
the first channel comprises a heterogeneous channel having the first semiconductor material adjacent to the intermediate channel and a third semiconductor material;
the second channel comprises a heterogeneous channel having the second semiconductor material adjacent to the intermediate channel and a fourth semiconductor material.

16. The memory cell of claim 15 wherein:
the third and fourth semiconductor materials are the same and comprise silicon; and
the first and second semiconductor materials are the same and comprise silicon germanium.

17. A method of forming a device comprising:
providing a substrate;
forming a vertical base on the substrate, wherein the base includes first and second channels between top and bottom terminals of a memory cell; and
forming first and second gates surrounding the first and second channels.

18. The method of claim 17 wherein the bottom terminal is part of the substrate.

19. The method of claim 17 wherein:
the first channel comprises a first semiconductor material; and
the second channel comprises a second semiconductor material, forming a heterogeneous base.

20. The method of claim 17 wherein:
forming the vertical base includes an intermediate channel between the first and second channels between the top and bottom terminals; and
forming an intermediate gate surrounding the intermediate channel.

* * * * *